US012148390B2

(12) United States Patent
Lin et al.

(10) Patent No.: US 12,148,390 B2
(45) Date of Patent: Nov. 19, 2024

(54) ELECTRONIC DISPLAY WITH IN-PIXEL COMPENSATION AND OXIDE DRIVE TRANSISTORS

(71) Applicant: Apple Inc., Cupertino, CA (US)

(72) Inventors: Chin-Wei Lin, San Jose, CA (US); Shinya Ono, Santa Clara, CA (US); Jung Yen Huang, Taoyuan (TW)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/962,239

(22) Filed: Oct. 7, 2022

(65) Prior Publication Data
US 2023/0035245 A1  Feb. 2, 2023

Related U.S. Application Data

(62) Division of application No. 17/075,587, filed on Oct. 20, 2020, now abandoned.

(60) Provisional application No. 62/953,054, filed on Dec. 23, 2019.

(51) Int. Cl.
*G09G 3/3266* (2016.01)
*G09G 3/20* (2006.01)
*G09G 3/3233* (2016.01)
*G09G 3/3291* (2016.01)

(52) U.S. Cl.
CPC ......... *G09G 3/3266* (2013.01); *G09G 3/2092* (2013.01); *G09G 3/3291* (2013.01)

(58) Field of Classification Search
None
See application file for complete search history.

(56) References Cited

U.S. PATENT DOCUMENTS 8,411,016 B2   4/2013 Tanikame et al.
8,648,848 B2   2/2014 Tsai et al.
(Continued)

FOREIGN PATENT DOCUMENTS

CN   205282058 U   6/2016
CN   104867442 B   10/2017
(Continued)

*Primary Examiner* — Sepehr Azari
(74) *Attorney, Agent, or Firm* — Treyz Law Group; Jason Tsai

(57) ABSTRACT

A display pixel may include an organic light-emitting diode, one or more emission transistors, a drive transistor, a gate setting transistor, a data loading transistor, and an initialization transistor. The drive transistor may be implemented as a semiconducting-oxide transistor to mitigate threshold voltage hysteresis to improve first frame response at high refresh rates, to reduce undesired luminance jumps at low refresh rates, and to reduce image sticking. The gate setting transistor may also be implemented as a semiconducting-oxide transistor to reduce leakage at the gate terminal of the drive transistor. The initialization transistor may also be implemented as a semiconducting-oxide transistor so that it can be controlled using a shared emission signal to reduce routing complexity. The remaining transistors in the pixel may be implemented as p-type silicon transistors. Display pixels configured in this way can support in-pixel threshold voltage compensation and on-bias stress phase to further mitigate the hysteresis.

12 Claims, 21 Drawing Sheets

(56) References Cited

U.S. PATENT DOCUMENTS

| | | | |
|---|---|---|---|
| 8,928,046 B2* | 1/2015 | Yan | H01L 29/66969 257/288 |
| 9,129,927 B2* | 9/2015 | Gupta | G09G 3/3611 |
| 9,224,908 B2 | 12/2015 | Kitazawa et al. | |
| 9,276,050 B2 | 3/2016 | Kwon et al. | |
| 9,489,875 B2 | 11/2016 | Hwang et al. | |
| 9,508,861 B2* | 11/2016 | Yamazaki | H01L 27/124 |
| 9,685,469 B2* | 6/2017 | Kim | H01L 21/26513 |
| 9,747,835 B2 | 8/2017 | Lee et al. | |
| 9,817,520 B2 | 11/2017 | Ikeda et al. | |
| 10,198,995 B1* | 2/2019 | Chen | G09G 3/3266 |
| 10,262,585 B2 | 4/2019 | Senda et al. | |
| 10,367,012 B2* | 7/2019 | Lim | H01L 29/7869 |
| 10,460,673 B2 | 10/2019 | Gao et al. | |
| 10,497,323 B2 | 12/2019 | Zhou et al. | |
| 2006/0044236 A1 | 3/2006 | Kim | |
| 2009/0283763 A1* | 11/2009 | Park | H01L 27/1225 257/E29.296 |
| 2010/0148168 A1* | 6/2010 | Lai | H01L 29/45 257/E29.1 |
| 2010/0176383 A1* | 7/2010 | Park | H01L 27/1225 438/46 |
| 2011/0017990 A1* | 1/2011 | Son | H01L 29/7869 257/E29.296 |
| 2011/0031497 A1* | 2/2011 | Yamazaki | H01L 27/1214 257/E27.111 |
| 2011/0037068 A1* | 2/2011 | Yamazaki | H01L 21/02614 257/E29.296 |
| 2011/0273419 A1* | 11/2011 | Park | G09G 3/3233 345/76 |
| 2012/0050252 A1 | 3/2012 | Akimoto et al. | |
| 2012/0062536 A1 | 3/2012 | Park | |
| 2013/0009145 A1* | 1/2013 | Jeon | H01L 27/14692 257/E21.409 |
| 2013/0194248 A1 | 8/2013 | Kim | |
| 2014/0361290 A1* | 12/2014 | Yamazaki | H01L 27/1251 257/43 |
| 2015/0021674 A1* | 1/2015 | Yamada | H01L 27/14632 257/292 |
| 2015/0037955 A1* | 2/2015 | Son | H10K 59/1213 257/43 |
| 2015/0053935 A1* | 2/2015 | Gupta | H01L 27/1255 257/43 |
| 2015/0054799 A1* | 2/2015 | Chang | H01L 27/1225 345/204 |
| 2015/0123084 A1* | 5/2015 | Kim | H10K 59/121 257/43 |
| 2015/0228803 A1* | 8/2015 | Koezuka | H01L 29/78696 257/43 |
| 2016/0063921 A1* | 3/2016 | Tsai | G09G 3/3233 345/76 |
| 2016/0071446 A1* | 3/2016 | Miyake | G09G 3/3233 702/64 |
| 2016/0104430 A1* | 4/2016 | Park | G09G 3/3291 345/204 |
| 2016/0125808 A1 | 5/2016 | Hsu et al. | |
| 2016/0140897 A1 | 5/2016 | Park et al. | |
| 2016/0163278 A1 | 6/2016 | Pappas et al. | |
| 2016/0260751 A1* | 9/2016 | Okazaki | H01L 29/4966 |
| 2016/0267844 A1 | 9/2016 | Senda et al. | |
| 2016/0274421 A1* | 9/2016 | Hirakata | G02F 1/133553 |
| 2016/0321990 A1* | 11/2016 | Kim | G09G 3/3233 |
| 2016/0321995 A1 | 11/2016 | Shin | |
| 2016/0351124 A1 | 12/2016 | Kim et al. | |
| 2016/0379552 A1 | 12/2016 | Kim et al. | |
| 2017/0084637 A1* | 3/2017 | Ge | H01L 29/78648 |
| 2017/0092193 A1* | 3/2017 | Na | G09G 3/3233 |
| 2017/0162113 A1* | 6/2017 | Lin | G09G 3/3266 |
| 2017/0243537 A1 | 8/2017 | Wu et al. | |
| 2017/0278459 A1 | 9/2017 | Jeon | |
| 2018/0033849 A1* | 2/2018 | Noh | H01L 27/124 |
| 2018/0061317 A1* | 3/2018 | Morita | H10K 59/1213 |
| 2018/0061915 A1 | 3/2018 | Yu | |
| 2018/0062105 A1* | 3/2018 | Lius | H10K 59/1213 |
| 2018/0090074 A1* | 3/2018 | Jin | G09G 3/3258 |
| 2018/0130409 A1 | 5/2018 | Xiang et al. | |
| 2018/0158406 A1* | 6/2018 | Kim | G09G 3/3283 |
| 2018/0182346 A1* | 6/2018 | Ryu | G09G 3/3677 |
| 2018/0331127 A1* | 11/2018 | Sasaki | H01L 27/127 |
| 2019/0057646 A1* | 2/2019 | Lin | G09G 3/3233 |
| 2019/0096321 A1* | 3/2019 | Yang | H10K 59/38 |
| 2019/0103055 A1 | 4/2019 | Gao | |
| 2019/0114970 A1 | 4/2019 | Moradi et al. | |
| 2019/0130826 A1* | 5/2019 | Yu | G09G 3/3225 |
| 2019/0130833 A1 | 5/2019 | Gao et al. | |
| 2019/0130843 A1* | 5/2019 | Yu | H10K 59/1315 |
| 2019/0130846 A1 | 5/2019 | Chung et al. | |
| 2019/0131376 A1 | 5/2019 | Hong et al. | |
| 2019/0147796 A1 | 5/2019 | Rha et al. | |
| 2019/0154439 A1 | 5/2019 | Binder | |
| 2019/0259325 A1 | 8/2019 | Chaji et al. | |
| 2020/0006401 A1* | 1/2020 | Hwang | G09G 3/3225 |
| 2020/0052056 A1* | 2/2020 | Park | H10K 71/00 |
| 2020/0212074 A1* | 7/2020 | Yamaguchi | H01L 27/1218 |
| 2020/0226978 A1 | 7/2020 | Lin et al. | |
| 2020/0320930 A1 | 10/2020 | Toyotaka et al. | |
| 2021/0013245 A1* | 1/2021 | Tanaka | H01L 27/1251 |
| 2021/0202639 A1* | 7/2021 | Tsubuku | H01L 29/7869 |
| 2021/0366389 A1* | 11/2021 | Liu | G09G 3/3233 |
| 2022/0059576 A1* | 2/2022 | Zhao | H01L 27/1237 |

FOREIGN PATENT DOCUMENTS

| | | | |
|---|---|---|---|
| CN | 108492779 A | 9/2018 | |
| CN | 109087610 A | 12/2018 | |
| CN | 110570818 A | 12/2019 | |
| EP | 2602783 B1 | 7/2018 | |
| EP | 2852947 B1 | 7/2018 | |
| EP | 3896736 A1 * | 10/2021 | H01L 27/1225 |
| JP | 2012047894 A | 3/2012 | |
| KR | 20070019463 A | 2/2007 | |
| KR | 20150051824 A | 5/2015 | |
| KR | 20190048736 A | 5/2019 | |
| KR | 20190098315 A | 8/2019 | |

* cited by examiner

ELECTRONIC DISPLAY WITH IN-PIXEL COMPENSATION AND OXIDE DRIVE TRANSISTORS

This application is a division of U.S. patent application Ser. No. 17/075,587, filed Oct. 20, 2020, which claims the benefit of provisional patent application No. 62/953,054, filed Dec. 23, 2019, which are hereby incorporated by reference herein in their entireties.

BACKGROUND

This relates generally to electronic devices with displays and, more particularly, to display driver circuitry for displays such as organic-light-emitting diode displays.

Electronic devices often include displays. For example, cellular telephones and portable computers include displays for presenting information to users.

Displays such as organic light-emitting diode displays have an array of display pixels based on light-emitting diodes. In this type of display, each display pixel includes a light-emitting diode and thin-film transistors for controlling application of a signal to the light-emitting diode to produce light.

An organic light-emitting diode display pixel includes a drive thin-film transistor connected to a data line via an access thin-film transistor. The access transistor may have a gate terminal that receives a scan signal via a corresponding scan line. Image data on the data line can be loaded into the display pixel by asserting the scan signal to turn on the access transistor. The display pixel further includes a current source transistor that provides current to the organic light-emitting diode to produce light.

Transistors in an organic light-emitting diode display pixel may be subject to process, voltage, and temperature (PVT) variations. Due to such variations, transistor threshold voltages between different display pixels may vary. Variations in transistor threshold voltages can cause the display pixels to produce amounts of light that do not match a desired image. It is within this context that the embodiments herein arise.

SUMMARY

An electronic device may include a display having an array of display pixels. The display pixels may be organic light-emitting diode display pixels. Each display pixel may include an organic light-emitting diode (OLED) that emits light, a drive transistor coupled in series with the OLED, first and second emission transistors coupled in series with the drive transistor and the OLED, a gate voltage setting transistor coupled between gate and drain terminals of the drive transistor, a single storage capacitor coupled across to the gate terminal of the drive transistor and the anode terminal of the OLED, a data loading transistor coupled between the source terminal of the drive transistor and a data line, and an initialization transistor coupled to the anode terminal of the OLED.

The drive transistor, gate voltage setting transistor, and the initialization transistor may be implemented as semiconducting-oxide transistors, whereas the emission transistors and the data loading transistor may be implemented as p-type silicon transistors (e.g., PMOS LTPS thin-film transistors). Implementing the drive transistor as a semiconducting-oxide transistor mitigates the drive transistor threshold voltage hysteresis to improve first frame response at high refresh rates, reduces undesired luminance jumps at low refresh rates, and reduces image sticking. Implementing the gate voltage setting transistor as a semiconducting-oxide transistor reduces leakage at the gate terminal of the drive transistor. Implementing the initialization transistor as a semiconducting-oxide transistor allows the initialization transistor and at least one of the emission transistors to be controlled by a shared emission signal to reduce routing complexity. Moreover, having only two types of thin-film transistors (e.g., only semiconducting-oxide transistors and p-type silicon transistors) reduces the total number of lithographic masks needs and thus help to minimize manufacturing cost.

During normal operation, a display pixel may undergo an initialization phase during which the initialization transistor is turned on to reset the anode terminal of the OLED. The initialization phase may be followed by one or more on-bias stress phases during which the data loading transistor is activated to load some data voltage at least partially onto the drive transistor. The optional on-bias stress phase may help further mitigate the drive transistor hysteresis and improve first frame response. The on-bias stress phase may be followed by a threshold voltage sampling and data loading phase, which is then followed by an emission phase. During the emission phase, the current flowing through the OLED will be independent of the drive transistor threshold voltage due to in-pixel threshold voltage cancellation.

The semiconducting-oxide transistors such as the semiconducting-oxide drive transistor may be formed above the silicon transistors. The storage capacitor may be stacked above the semiconducting-oxide drive transistor so that the top plate of the storage capacitor at least partially covers the gate conductor of the semiconducting-oxide drive transistor. Configured in this way, the storage capacitor provides electrical shielding to reduce pixel crosstalk while also providing optical shielding to prevent stray light from impacting the operation of the semiconducting-oxide drive transistor. If desired, any one or more of the semiconducting-oxide transistor may have a dual/double gate configuration having a top gate conductor and a bottom gate conductor. The bottom gate conductor may serve as an additional light shield and may be optionally coupled to the source terminal or the gate terminal of that semiconducting-oxide transistor.

DETAILED DESCRIPTION

Figure 1:
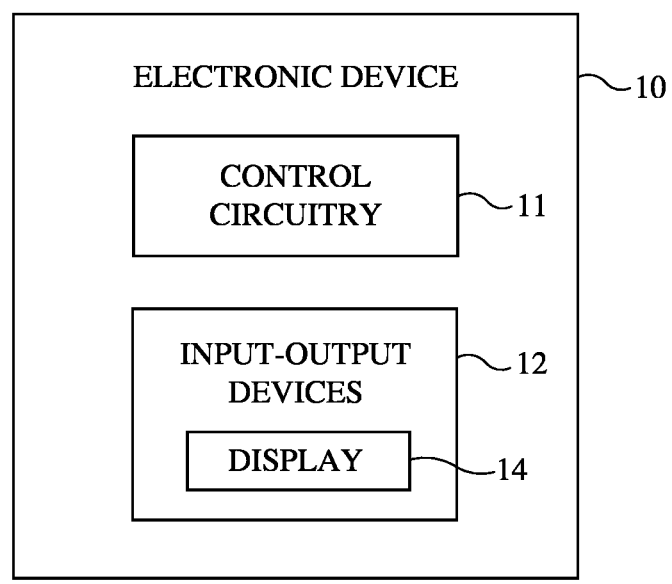
FIG. 1 is a diagram of an illustrative electronic device having a display in accordance with an embodiment.

An illustrative electronic device of the type that may be provided with an organic light-emitting diode (OLED) display is shown in FIG. 1. As shown in FIG. 1, electronic device 10 may have control circuitry 11. Control circuitry 11 may include storage and processing circuitry for supporting the operation of device 10. The storage and processing circuitry may include storage such as hard disk drive storage, nonvolatile memory (e.g., flash memory or other electrically-programmable-read-only memory configured to form a solid-state drive), volatile memory (e.g., static or dynamic random-access-memory), etc. Processing circuitry in control circuitry 11 may be used to control the operation of device 10. The processing circuitry may be based on one or more microprocessors, microcontrollers, digital signal processors, baseband processors, power management units, audio codec chips, application-specific integrated circuits, programmable integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 11 may be used to run software on device 10 such as operating system code and applications. During operation of device 10, the software running on control circuitry 11 may display images on display 14 in input-output devices.

Figure 2:
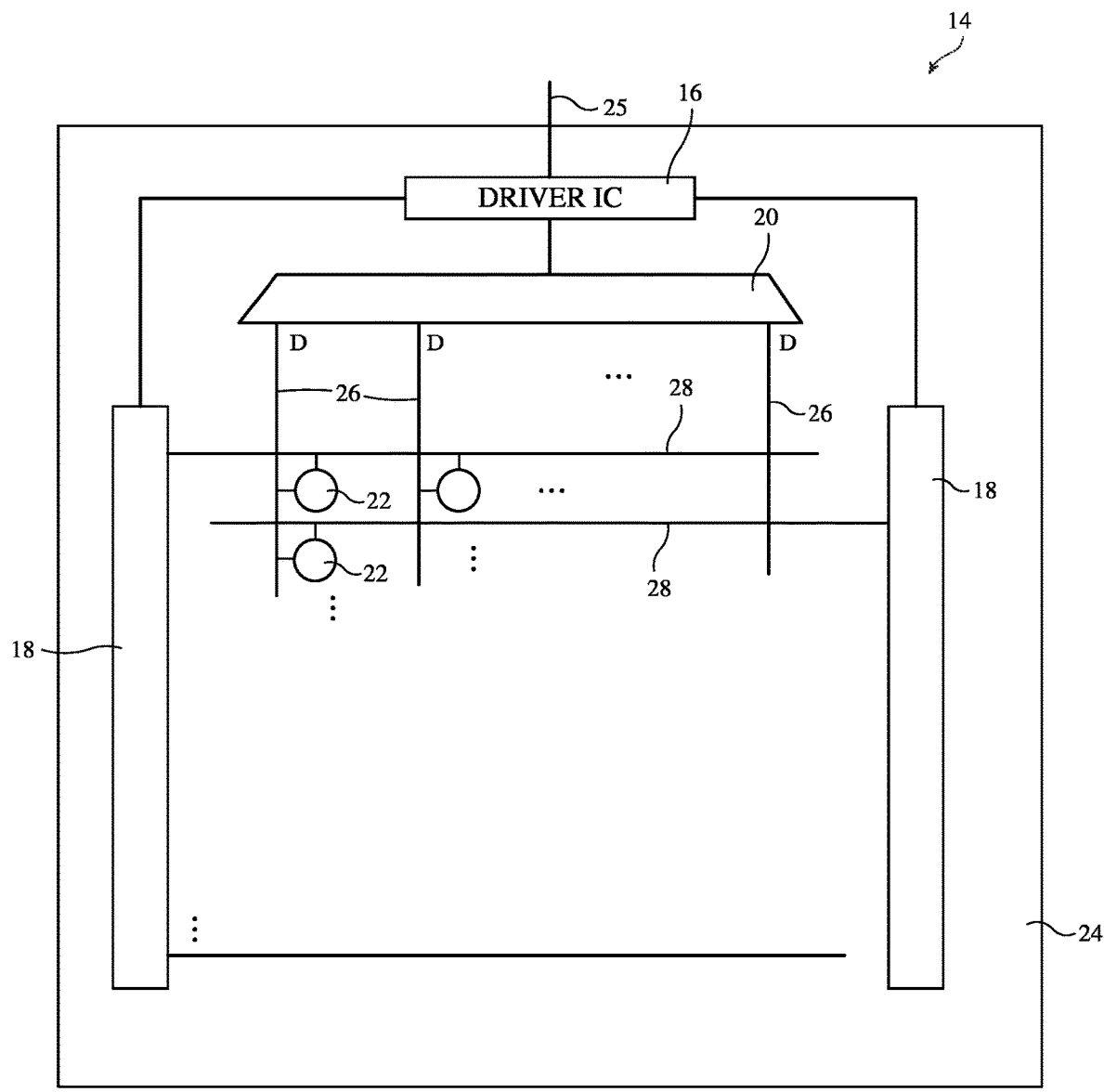
FIG. 2 is a diagram of an illustrative display such as an organic light-emitting diode display having an array of organic light-emitting diode display pixels in accordance with an embodiment.

FIG. 2 is a diagram of an illustrative display such as an organic light-emitting diode display 14 having an array of organic light-emitting diode display pixels 22. As shown in FIG. 2, display 14 may have one or more layers such as substrate 24. Layers such as substrate 24 may be formed from planar rectangular layers of material such as planar glass layers. Display 14 may have an array of display pixels 22 for displaying images for a user. The array of display pixels 22 may be formed from rows and columns of display pixel structures on substrate 24. These structures may include thin-film transistors such as polysilicon thin-film transistors, semiconducting-oxide thin-film transistors, etc. There may be any suitable number of rows and columns in the array of display pixels 22 (e.g., ten or more, one hundred or more, or one thousand or more).

Display driver circuitry such as display driver integrated circuit 16 may be coupled to conductive paths such as metal traces on substrate 24 using solder or conductive adhesive. Display driver integrated circuit 16 (sometimes referred to as a timing controller chip) may contain communications circuitry for communicating with system control circuitry over path 25. Path 25 may be formed from traces on a flexible printed circuit or other cable. The system control circuitry may be located on a main logic board in an electronic device such as a cellular telephone, computer, television, set-top box, media player, portable electronic device, or other electronic equipment in which display 14 is being used. During operation, the system control circuitry may supply display driver integrated circuit 16 with information on images to be displayed on display 14 via path 25. To display the images on display pixels 22, display driver integrated circuit 16 may supply clock signals and other control signals to display driver circuitry such as row driver circuitry 18 and column driver circuitry 20. Row driver circuitry 18 and/or column driver circuitry 20 may be formed from one or more integrated circuits and/or one or more thin-film transistor circuits on substrate 24.

Row driver circuitry 18 may be located on the left and right edges of display 14, on only a single edge of display 14, or elsewhere in display 14. During operation, row driver circuitry 18 may provide row control signals on horizontal lines 28 (sometimes referred to as row lines, "scan" lines, or "emission" lines). Row driver circuitry 18 may therefore sometimes be referred to as scan line driver circuitry or emission line driver circuitry. Row driver circuitry 18 may also be used to provide other row control signals, if desired.

Column driver circuitry 20 may be used to provide data signals D from display driver integrated circuit 16 onto a plurality of corresponding vertical lines 26. Column driver circuitry 20 may sometimes be referred to as data line driver circuitry or source driver circuitry. Vertical lines 26 are sometimes referred to as data lines. During compensation operations, column driver circuitry 20 may optionally use paths such as vertical lines 26 to supply a reference voltage, an initialization signal, or other suitable bias voltage signal. During programming operations, display data is loaded into display pixels 22 using lines 26.

Each data line 26 is associated with a respective column of display pixels 22. Sets of horizontal signal lines 28 run horizontally through display 14. Power supply paths and other lines may also supply signals to pixels 22. Each set of horizontal signal lines 28 is associated with a respective row of display pixels 22. The number of horizontal signal lines in each row may be determined by the number of transistors in the display pixels 22 that are being controlled independently by the horizontal signal lines. Display pixels of different configurations may be operated by different numbers of control lines, data lines, power supply lines, scan lines, emission lines, reference voltage lines, initialization lines, etc.

Row driver circuitry 18 may assert control signals on the row lines 28 in display 14. For example, driver circuitry 18 may receive clock signals and other control signals from display driver integrated circuit 16 and may, in response to the received signals, assert control signals in each row of display pixels 22. Rows of display pixels 22 may be processed in sequence, with processing for each frame of image data starting at the top of the array of display pixels and ending at the bottom of the array (as an example). While the scan lines in a row are being asserted, the control signals and data signals that are provided to column driver circuitry 20 by circuitry 16 direct circuitry 20 to demultiplex and drive associated data signals D onto data lines 26 so that the display pixels in the row will be programmed with the display data appearing on the data lines D. The display pixels can then display the loaded display data.

In practice, transistors in display pixel 22 may be subject to process, voltage, and temperature (PVT) variations. Due to such variations, transistor threshold voltages between different display pixels 22 may vary and can potentially cause pixels 22 to produce amounts of light that do not match a desired image. FIG. 3 is a circuit diagram of an illustrative organic light-emitting diode display pixel 22 in display 14 that is operable to support "in-pixel" threshold voltage compensation (e.g., a pixel configured to internally cancel out any threshold voltage dependence without any external current sensing operations). As shown in FIG. 3, display pixel 22 may include an organic light-emitting diode such as OLED 304, a storage capacitor such as capacitor Cst1, a drive transistor such as transistor Tdrive, a gate voltage setting transistor coupled across the gate (G) and drain (D) terminal of the drive transistor such as transistor Tgd, a first emission transistor such as transistor Tem1, a second emission transistor such as transistor Tem2, a data loading transistor such as transistor Tdata, and an initialization transistor such as transistor Tini.

Figure 3A:
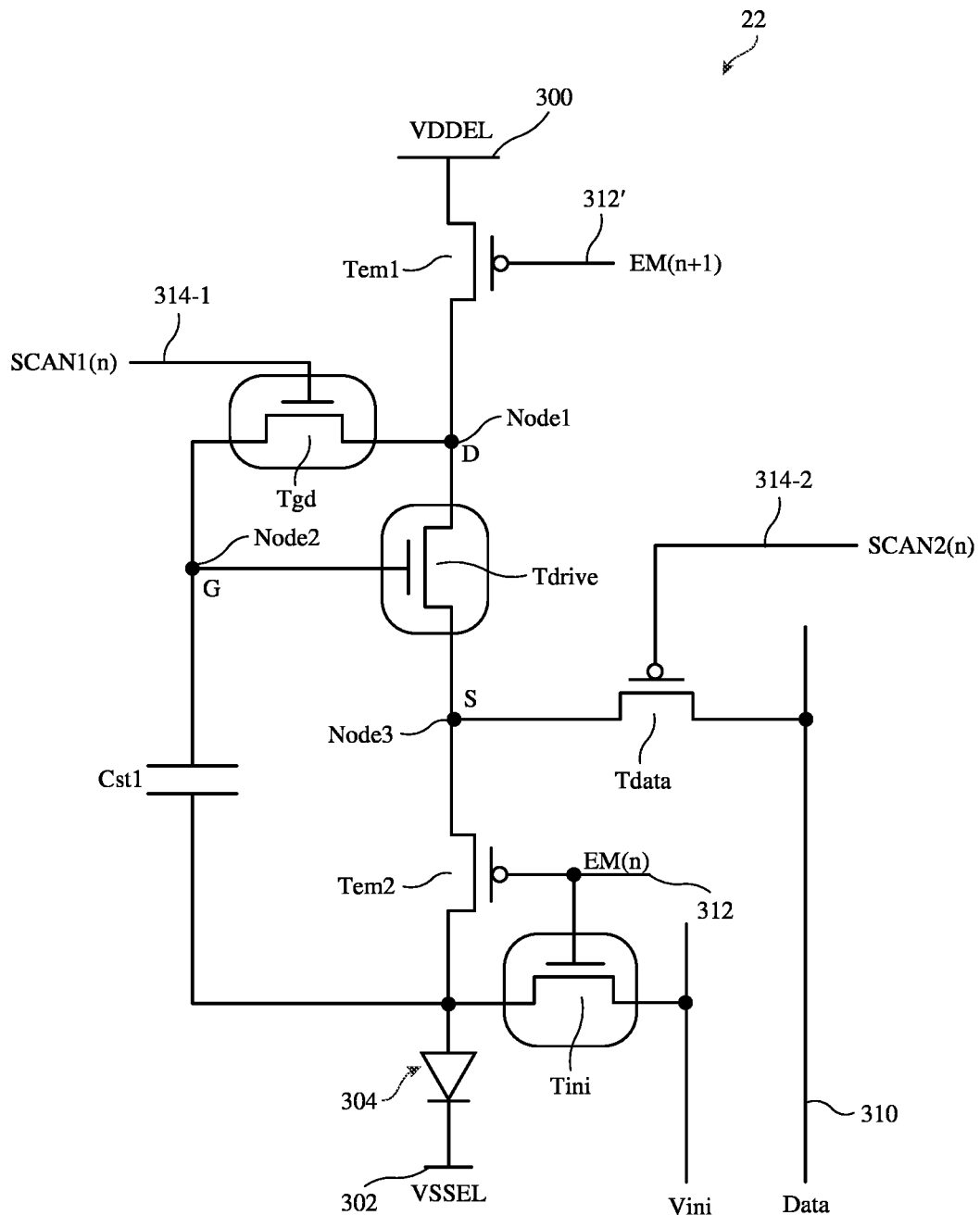
FIG. 3A is a circuit diagram of an illustrative display pixel having a semiconducting-oxide drive transistor in accordance with an embodiment.

Pixel 22 may further be coupled to a positive power supply terminal 300 on which positive power supply voltage VDDEL is supplied and to a ground power supply terminal 302 on which ground power supply voltage VSSEL is supplied. Positive power supply voltage VDDEL may be 3 V, 4 V, 5 V, 6 V, 7 V, 2 to 8 V, or any suitable positive power supply voltage level. Ground power supply voltage VSSEL may be 0 V, +1 V, −1 V, −2 V, −3 V, −4 V, −5 V, −6V, −7 V, or any suitable ground or negative power supply voltage level. The drive transistor Tdrive, the emission transistors Tem1 and Tem2, and diode 304 may be coupled in series between power supply lines 300 and 302. Drive transistor Tdrive may have a drain terminal (labeled as Node1), a gate terminal (labeled as Node2), and a source terminal (labeled as Node3). In the example of FIG. 3A, the first emission transistor Tem1 may be coupled between power supply terminal 300 and Node1, whereas the second emission transistor Tem2 may be coupled between Node3 and the anode terminal of diode 304. The terms "source" and "drain" terminals of a transistor can sometimes be used interchangeably and may therefore sometimes be referred to as "source-drain" terminals.

The first emission transistor Tem1 has a gate terminal configured to receive emission signal EM(n+1) via emission line 312', whereas the second emission transistor Tem2 has a gate terminal configured to receive emission signal EM(n) via emission line 312. The notation "(n)" indicates that the corresponding signal is generated using a gate driver associated with that row of display pixels, whereas the notation "(n+1)" indicates that the corresponding signal is generated using a gate driver associated with a subsequent row in the display pixel array. Both emission transistors Tem1 and Tem2 have to be on at the same time for an emission current to flow through the drive transistor to diode 304. The state of drive transistor Tdrive controls the amount of current flowing from terminal 300 to terminal 302 through diode 304, and therefore the amount of light emitted from diode 304 of display pixel 22. Organic light-emitting diode 304 may have an associated parasitic capacitance $C_{OLED}$ (not shown).

Storage capacitor Cst1 may have a first terminal that is coupled to Node2 and a second terminal that is coupled to the anode terminal of diode 304. Image data that is loaded into pixel 22 can be at least be partially stored on pixel 22 by using capacitor Cst1 to hold charge throughout the emission phase.

Transistor Tgd may have a drain terminal coupled to Node1, a gate terminal configured to receive scan signal SCAN1($n$) via a first scan line 314-1, and a source terminal coupled to Node2. Signal SCAN1($n$) may be asserted (e.g., driven high or temporarily pulsed high) to turn on n-type transistor Tgd to short the drain and gate terminals of transistor Tdrive. A transistor configuration where the gate and drain terminals are shorted is sometimes referred to as a "diode-connected" arrangement. Gate setting transistor Tgd may therefore sometimes be referred to as a diode connecting transistor.

Data loading transistor Tdata may have a source terminal coupled to data line 310, a gate terminal configured to receive scan control signal SCAN2($n$) via a second scan line 314-2, and a drain terminal coupled to Node3. Configured in this way, signal SCAN2($n$) can be asserted (e.g., driven low or temporarily pulsed low) to turn on transistor Tdata, which will allow a data signal from data line 310 to be loaded onto Node3.

Initialization transistor Tini may have a drain terminal coupled to the anode terminal of diode 304, a gate terminal configured to receive emission signal EM(n) via emission line 312, and a source terminal coupled to an initialization line 308. Initialization line 308 may be used to supply an initialization voltage Vini (e.g., a negative voltage such as −1 V, −2 V, −3 V, −4V, −5 V, −6 V, or other suitable voltage) to assist in turning off diode 304 when diode 304 is not in use. Configured in this way, emission signal EM(n) can be driven high or temporarily pulsed high to turn on transistor Tini to set the anode terminal to the initialization voltage Vini.

In the example of FIG. 3A, gate setting transistor Tgd, drive transistor Tdrive, and initialization transistor Tini may be implemented using semiconducting-oxide transistors (e.g., a transistor with an n-type channel formed from semiconducting oxide such as indium gallium zinc oxide or IGZO or indium tin zinc oxide or ITZO), whereas the remaining transistors Tem1, Tem2, and Tdata may be thin-film transistors (TFTs) formed from a semiconductor such as silicon (e.g., polysilicon channel deposited using a low temperature process, sometimes referred to as LTPS or low-temperature polysilicon). The semiconducting-oxide transistors in pixel 22 are denoted with a circle surrounding those transistors. Semiconducting-oxide transistors exhibit relatively lower leakage than silicon transistors, so implementing transistor Tgd as a semiconducting-oxide transistor can help prevent current from leaking at the gate terminal of transistor Tdrive and will help reduce flicker.

In accordance with an embodiment, implementing the drive transistor Tdrive as a semiconducting-oxide transistor can help provide improved first frame response for high refresh rate operations (e.g., displays operating at a refresh rate of at least 60 Hz, at least 120 Hz, at least 240 Hz, etc.), can help reduce undesired luminance jumps for low refresh rate operations (e.g., displays operating at a refresh rate of 1 Hz, 2 Hz, 1-10 Hz, less than 30 Hz, less than 60 Hz, or other low rate), and can help reduce image sticking (i.e., the phenomenon where a current image resists changing to a new image).

As described above, the amount of emission current flowing through each display pixel is dependent on the threshold voltage of the drive transistor. The drive transistor threshold voltage may also vary depending on the current value of the gate-to-source voltage Vgs of the drive transistor. For example, the drive transistor threshold voltage may exhibit a first average level when Vgs is being raised from low to high, but may exhibit a second average level that is different than the first average level when Vgs is being lowered from high to low, thus yielding different current-voltage (I-V) characteristic curves. This dependence of the threshold voltage on the actual Vgs value is sometimes referred to as transistor "hysteresis," and if care is not taken, this hysteresis can negatively impact the performance of the display pixel.

Since the threshold voltage of transistor Tdrive may experience hysteresis, forming the drive transistor as a top-gate semiconducting-oxide transistor can help reduce the hysteresis (e.g., a top-gate IGZO transistor experiences less threshold voltage hysteresis than a silicon transistor). In such scenarios, it may be desirable to form all of the semiconducting-oxide transistors Tdrive, Tgd, and Tini as top-gate oxide transistors to help simplify manufacturing steps. Compared to silicon transistors, semiconducting-oxide transistors exhibit greater current sensitivity to temperature changes, so pixels 22 of the type shown in FIG. 3A having semiconducting-oxide drive transistors should be used in electronic devices with a well-controlled or manageable temperature profile across the display.

Moreover, implementing transistor Tini as a semiconducting-oxide transistor enables transistors Tem2 and Tini to be controlled by the same signal EM(n) since driving EM(n) low will turn on Tem2 while turning off Tini and vice versa. Sharing signal EM(n) enables fewer row control lines to be formed, which reduces routing complexity. Forming pixel 22 using only n-type semiconducting-oxide transistors and only p-type silicon transistors obviates the need to form complementary n-type silicon transistors, which can help dramatically reduce the number of masks needed to manufacture pixel 22 and reduce cost.

Control signals from display driver circuitry such as row driver circuitry 18 of FIG. 2 are supplied to control terminals such as row control lines 312, 312' 314-1, and 314-2. The semiconducting-oxide transistors in pixel 22 (e.g., transistors Tdrive, Tgd, and Tini) are n-channel devices and are "active-high" devices, which are turned on by asserting or driving high their respective gate control voltages. In contrast, the p-channel silicon transistors in pixel 22 (e.g., transistors Tem1, Tem2, and Tdata) are "active-low" devices, which are turned on by asserting or driving low their respective gate control voltages.

The pixel structure shown and described in connection with FIG. 3A is merely illustrative and is not intended to limit the scope of the present embodiments. If desired, any one or more of transistors Tem1, Tem2, and Tdata may be implemented as an n-type silicon transistor or a semiconducting-oxide transistor; any one or more of transistors Tdrive, Tgd, and Tini may be implemented as an n-type or p-type silicon transistor; pixel 22 may include one or more additional capacitors; pixel 22 may include more than six TFTs or less than six TFTs; pixel 22 may be controlled by more than two or less than two scan control lines; pixel 22 may be controlled by more than two or less than two emission control lines; just to name a few alternative arrangements.

Figure 3B:
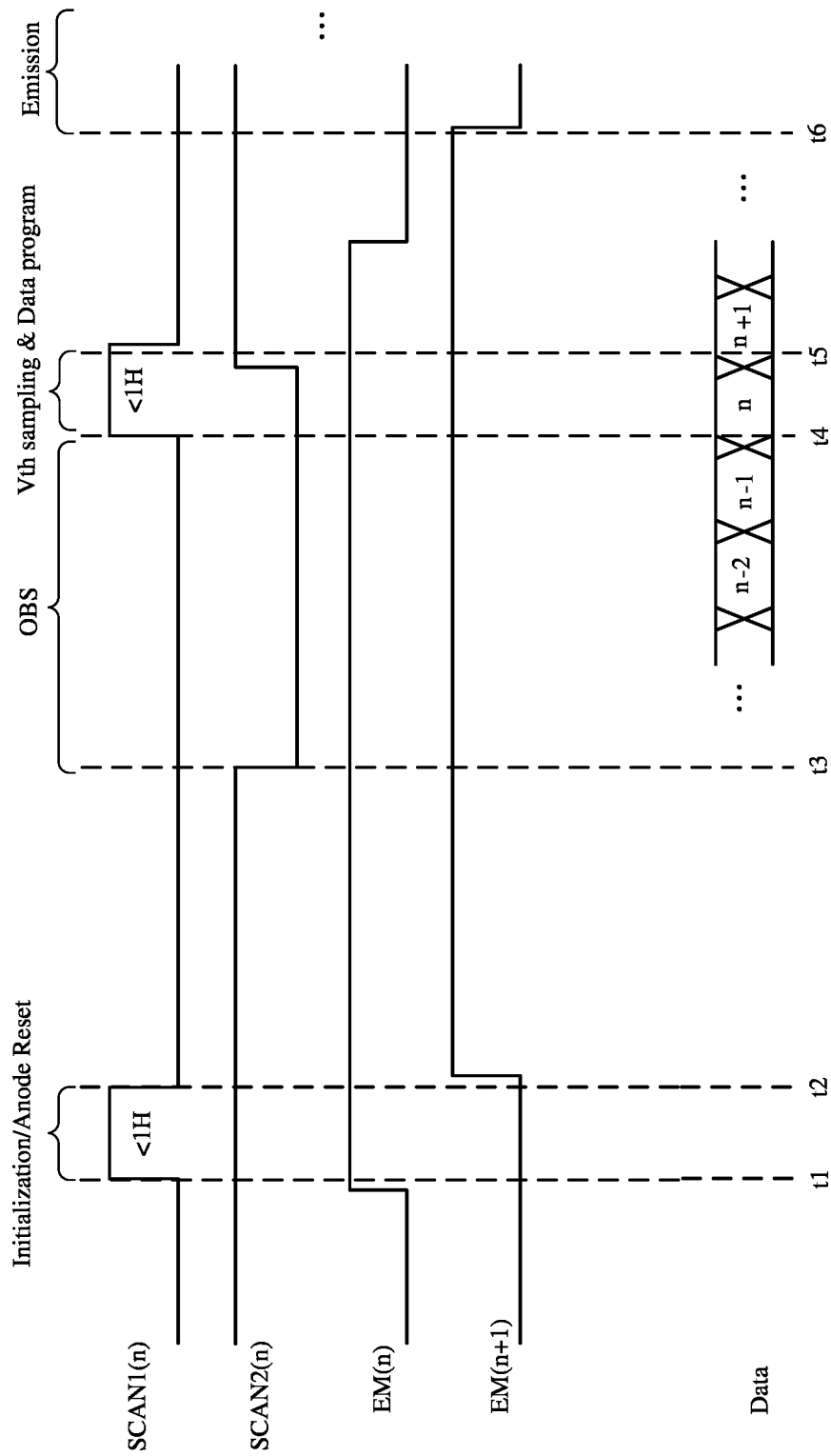
FIG. 3B is a timing diagram illustrating one suitable way of operating the display pixel shown in FIG. 3A in accordance with an embodiment.

During normal data refresh period, display pixel 22 may be operated in at least four different types of phases: (1) an initialization/reset phase, (2) an on-bias stress phase, (3) a threshold voltage sampling and data programming phase, and (4) an emission phase—not necessarily in this order. FIG. 3B is a timing diagram showing relevant signal waveforms that may be applied to display pixel 22 during the data refresh period for a given pixel row (n).

Prior to time t1, emission signals EM(n) and EM(n+1) are both low, thereby turning on both emission transistors Tem1 and Tem2, so pixel 22 is in the emission phase. At time t1, signal EM(n) is driven high, which turns off transistor Tem2 and temporality halts emission. Driving high EM(n) also turns on transistor Tini to load initialization voltage Vini onto the anode terminal of diode 304 (i.e., the anode terminal is set to Vini). The period from time t1 to t2 is therefore sometimes referred to as the "initialization" or "anode reset" phase. During the anode reset period, signal SCAN1(n) is also pulsed high for less than one row time (<1H), which turns on transistor Tgd. Activating transistor Tgd will pull Node2 all the way up to VDDEL since transistor Tem1 is still on. Operated in this way, the voltage across the storage capacitor Cst1 will be reset to a predetermined voltage difference (VDDEL-Vini) by the end of the initialization phase.

In certain situations, the drive transistor threshold voltage Vth can shift, such as when display 14 is transitioning from a black image to a white image or when transitioning from one gray level to another. This shift in drive transistor Vth (sometimes referred to herein as thin-film transistor "hysteresis") can cause a reduction in luminance, which is otherwise known as "first frame dimming." For example, the saturation current Ids waveform as a function of Vgs of the drive transistor for a black frame might be slightly offset from the target Ids waveform as a function of Vgs of the drive transistor for a white frame. Without performing on-bias stress, the sampled Vth will correspond to the black frame and will therefore deviate from the target Ids waveform by quite a large margin. By performing on-bias stress, the sampled Vth will correspond to Vdata and will therefore be much closer to the target Ids curve. Performing the on-bias stress phase to bias the Vgs of the drive transistor with some data signal before sampling Vth can therefore help mitigate hysteresis and improve first frame response. An on-bias stress phase may therefore be defined as an operation that applies a suitable bias voltage directly to the drive transistor during non-emission phases (e.g., such as by turning on the data loading transistor or the initialization transistor). At time t3, signal SCAN2(n) is driven low, which turns on transistor Tdata to load some non-zero data values (e.g., data intended for at least some preceding rows such as rows (n-2) and (n-1) in the display pixel array) onto Node3. Pre-biasing the source terminal of the drive transistor prior to the actual data programming period between t4-t5 can help mitigate Vth hysteresis and prevent first frame dimming.

At time t4, signal SCAN1(n) is pulsed high, which temporarily activates transistor Tgd. Since signal SCAN2(n) remains low during this time, transistor Tdata will load the actual data signal intended for row n into the corresponding pixel 22 so that the voltage at Node3 will be equal to Vdata. Since the drive transistor is currently in the diode-connected configuration (because Tgd is turned on to short the gate and drain terminals), the drive transistor will pull its gate voltage down to (Vdata+Vth), where Vth represents the threshold voltage of the drive transistor. At this point, the voltage across capacitor Cst1 is now set to (Vdata+Vth−Vini). Operated in this way, the drive transistor threshold voltage Vth has been successfully sampled and Vdata has been successfully programmed/written onto storage capacitor Cst1. The time period from t4 to t5 may therefore be referred to as the Vth sampling and data programming phase. At time t5, signal SCAN1(n) is driven low to turn off transistor Tgd while signal SCAN2(n) is driven high to turn off transistor Tdata, thereby terminating the Vth sampling and data writing phase.

At time t6, signals EM(n) and EM(n+1) are both low, thereby turning on transistors Tem1 and Tem1 and thus starting the emission phase. During the emission period, Node3 may be pulled up to VDDEL. The resulting gate-to-source voltage Vgs of transistor Tdrive will therefore be some function of (Vdata+Vth−Vini) as sampled by storage capacitor Cst1. Since the final emission current is proportional to Vgs minus Vth, the emission current will be independent of Vth since (Vgs−Vth) will be equal to (Vdata+Vth−Vini−Vth), where Vth cancels out. This type of operating scheme where the drive transistor threshold voltage is internally sampled and canceled out is sometimes referred to as "in-pixel" threshold voltage compensation.

Figure 3C:
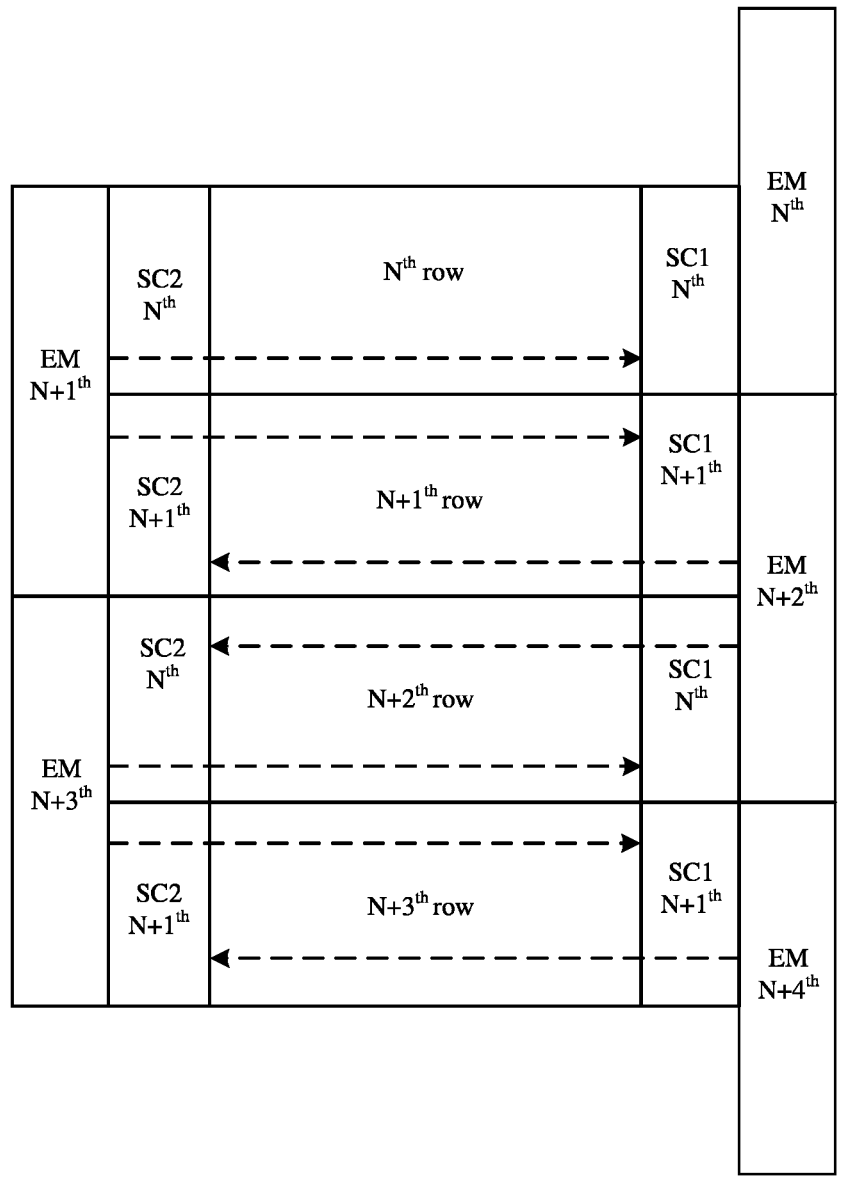
FIG. 3C is a diagram showing an illustrative arrangement of gate driver circuits for driving an array of display pixels of the type shown in FIG. 3A in accordance with an embodiment.

The example of FIG. 3A involves reusing emission signals from adjacent rows (e.g., signal EM(n+1) may be borrow and used in row n). FIG. 3C is a diagram showing an illustrative arrangement of gate driver circuits for driving an array of display pixels of the type shown in FIG. 3A. As shown in FIG. 3C, each row may have its own dedicated SCAN1 (SC1) and SCAN2 (SC2) driver circuit. However, the EM driver circuits may be shared between neighboring rows. In the example of FIG. 3C, the EM(n+1) driver circuit may control both the $n^{th}$ row and the $(n+1)^{th}$ row; the EM(n+2) driver circuit may drive both the $(n+1)^{th}$ row and the $(n+2)^{th}$ row; the EM(n+3) driver may be routed to both the $(n+2)^{th}$ row and the $(n+3)^{th}$ row; and so on. Driving the display pixel array using this staggered, sharing pattern can help reduce display border width.

Figure 3D:
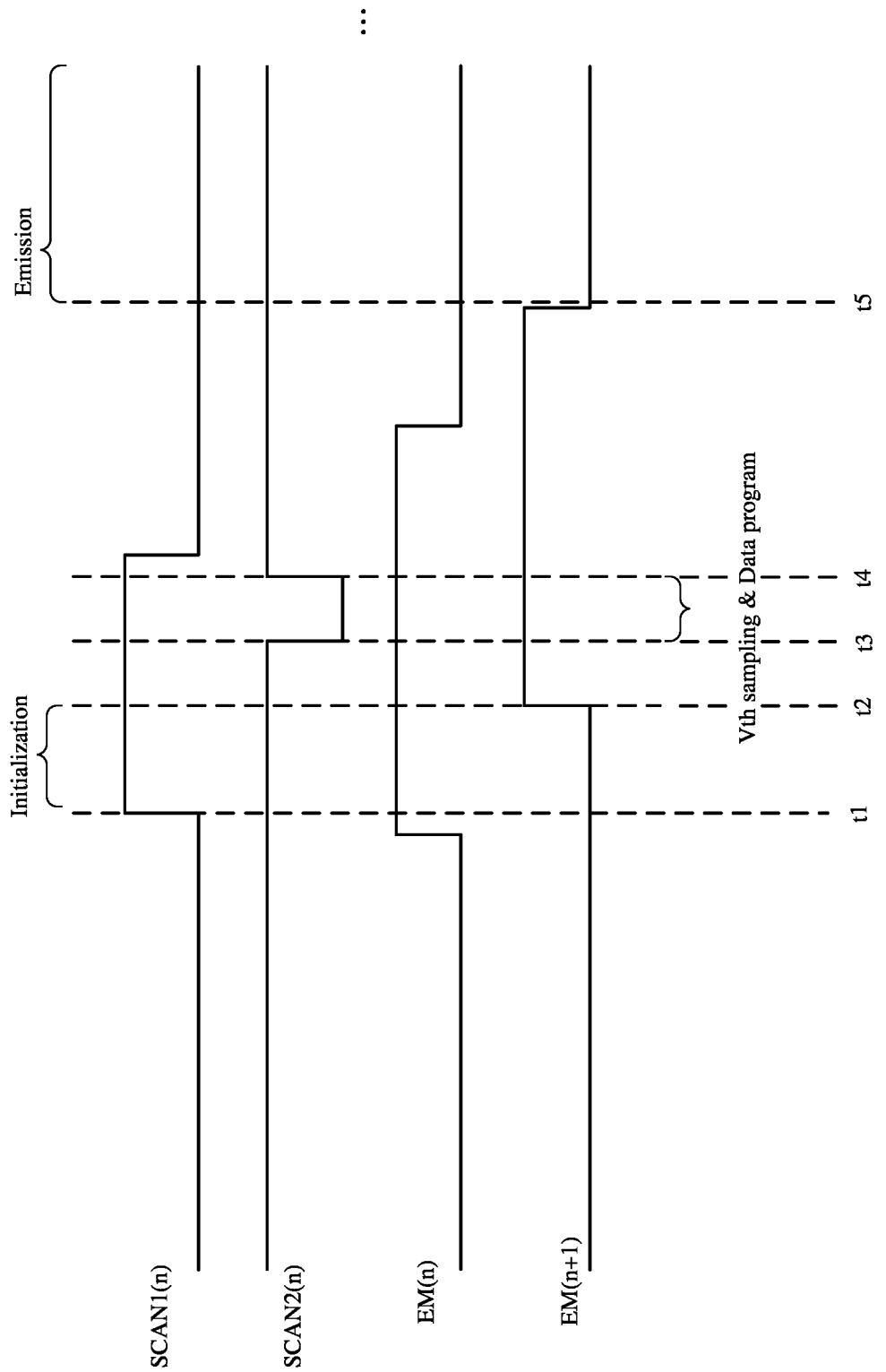
FIGS. 3D, 3E, and 3F are timing diagrams illustrating various suitable ways of operating the display pixel shown in FIG. 3A in accordance with an embodiment.

As described above in connection with FIG. 3A, implementing the drive transistor as a semiconducting-oxide transistor can already help mitigate any undesired hysteresis. The on-bias stress (OBS) phase shown in FIG. 3B can help further suppress any remaining hysteresis. In scenarios where the hysteresis is already managed at an acceptable level via the use of a semiconducting-oxide drive transistor, the on-bias stress phase can be skipped to help improve the speed of the overall refresh operation and reduce power consumption. FIG. 3D is a timing diagram illustrating another suitable way for operating pixel 22 of the type shown in FIG. 3A. In contrast to FIG. 3A, the operation of FIG. 3D does not include an on-bias stress phase.

Prior to time t1, emission signals EM(n) and EM(n+1) are both low, thereby turning on both emission transistors Tem1 and Tem2, so pixel 22 is in the emission phase. At time t1, signal EM(n) is driven high, which turns off transistor Tem2 and temporality halts emission. Driving high signal EM(n) also turns on transistor Tini to load initialization voltage Vini onto the anode terminal of diode 304 (i.e., the anode terminal is set to Vini). The period from time t1 to t2 is therefore sometimes referred to as the "initialization" or "anode reset" phase. During the anode reset period, signal SCAN1(n) is also raised high, which turns on transistor Tgd.

At time t3, signal SCAN2(n) is pulsed low, which turns on transistor Tdata to load in a desired data value onto Node3. Since signal SCAN1(n) remains high during this time, the drive transistor remains in the diode-connected configuration, so both data signal Vdata and the drive transistor threshold voltage Vth will be sampled onto the storage capacitor Cst1. At time t4, signal SCAN1(n) is driven low to turn off transistor Tgd while signal SCAN2(n) is driven high to turn off transistor Tdata, thereby terminating the Vth sampling and data programming phase. At time t5, signals EM(n) and EM(n+1) are both low to start the emission phase. In the example of FIG. 3D, signal SCAN1(n) is held high from the start of the initialization phase until the end of the data programming phase (i.e., from time t1 until t4).

Figure 3E:
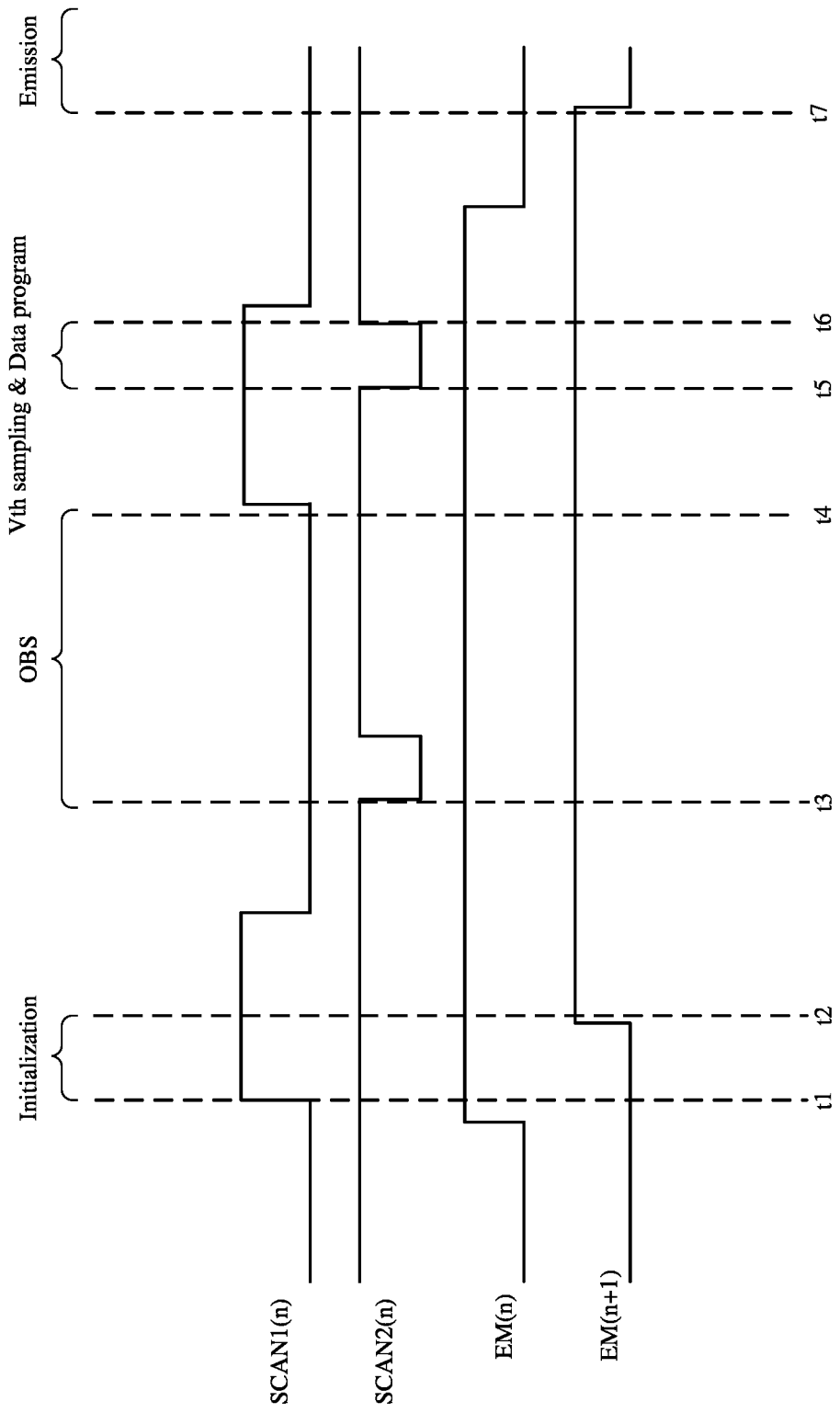

FIG. 3E is a timing diagram illustrating another suitable way for operating pixel 22 during the data refresh period. Similar to the operation shown in FIG. 3B, the operation illustrated in FIG. 3E also includes an on-bias stress phase but implemented using a different scan line behavior. Prior to time t1, emission signals EM(n) and EM(n+1) are both low, so both emission transistors Tem1 and Tem2 are on during the emission phase. At time t1, signal EM(n) is driven high, which turns off transistor Tem2 and temporality halts emission. Driving high EM(n) also turns on transistor Tini to load initialization voltage Vini onto the anode terminal of diode 304 (i.e., the anode terminal is set to Vini). The period from time t1 to t2 is therefore sometimes referred to as the "initialization" or "anode reset" phase. During the anode reset period, signal SCAN1(n) is also pulsed high, which turns on transistor Tgd. Activating transistor Tgd will pull Node2 all the way up to VDDEL since transistor Tem1 is still on.

At time t3, signal SCAN2(n) is pulsed low, which turns on transistor Tdata to load some non-zero data values (e.g., data signals intended for at least some preceding rows in the display pixel array) onto Node3. Pre-biasing the source terminal of the drive transistor prior to the actual data programming period between t4-t5 can help mitigate Vth hysteresis and improve first frame response. This on-bias stress (OBS) phase may last from the start of the SCAN2(n) pulse at time t3 until signal SCAN1(n) is driven high at time t4.

Figure 3F:
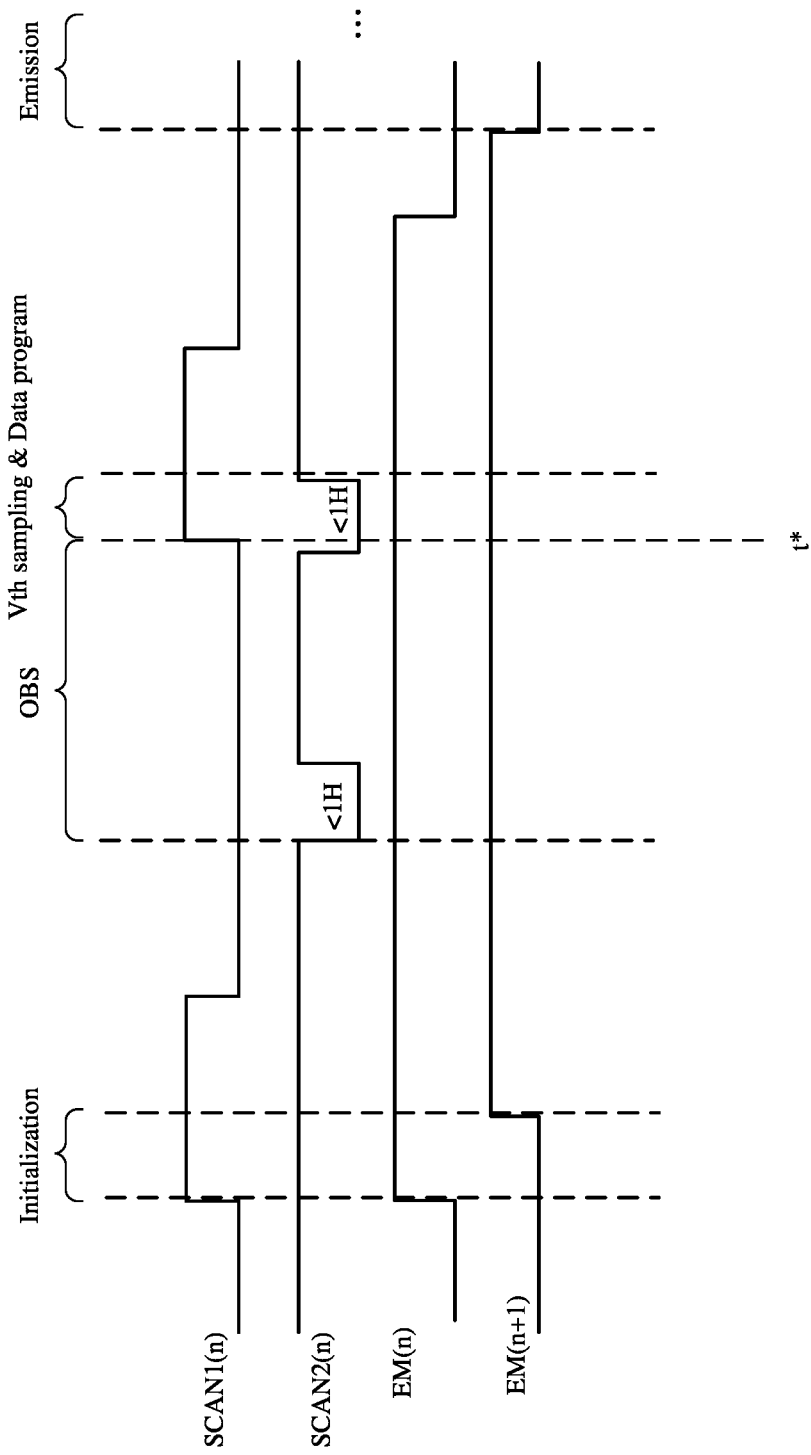

At time t4, signal SCAN1(n) is pulsed high, which temporarily activates transistor Tgd. At time t5, signal SCAN2(n) is pulsed low to perform the Vth sampling and data writing phase. While signal SCAN2(n) is low from time t5-t6, transistor Tdata is turned on to load the actual data signal intended for row n into the corresponding pixel 22 so that the voltage at Node3 will be equal to Vdata. Since the drive transistor is in the diode-connected configuration (because Tgd is turned on to short the gate and drain terminals), the drive transistor will pull its gate voltage down to (Vdata+Vth), where Vth represents the threshold voltage of the drive transistor. At this point, the voltage across capacitor Cst1 is now set to (Vdata+Vth-Vini) and is primed from in-pixel Vth compensation. At time t7, signals EM(n) and EM(n+1) are both low to start the emission phase. FIG. 3F is a timing diagram that illustrates yet another suitable way for operating pixel 22 of the type shown in FIG. 3A. The operation of FIG. 3F is similar to that shown and described in connection with FIG. 3E but the Vth sampling and data programming phase immediately follows the on-bias stress phase. This may be accomplished by aligning the second low pulse in SCAN2(n) with the rising edge of signal SCAN1(n) (see, e.g., at time t*).

Figure 4A:
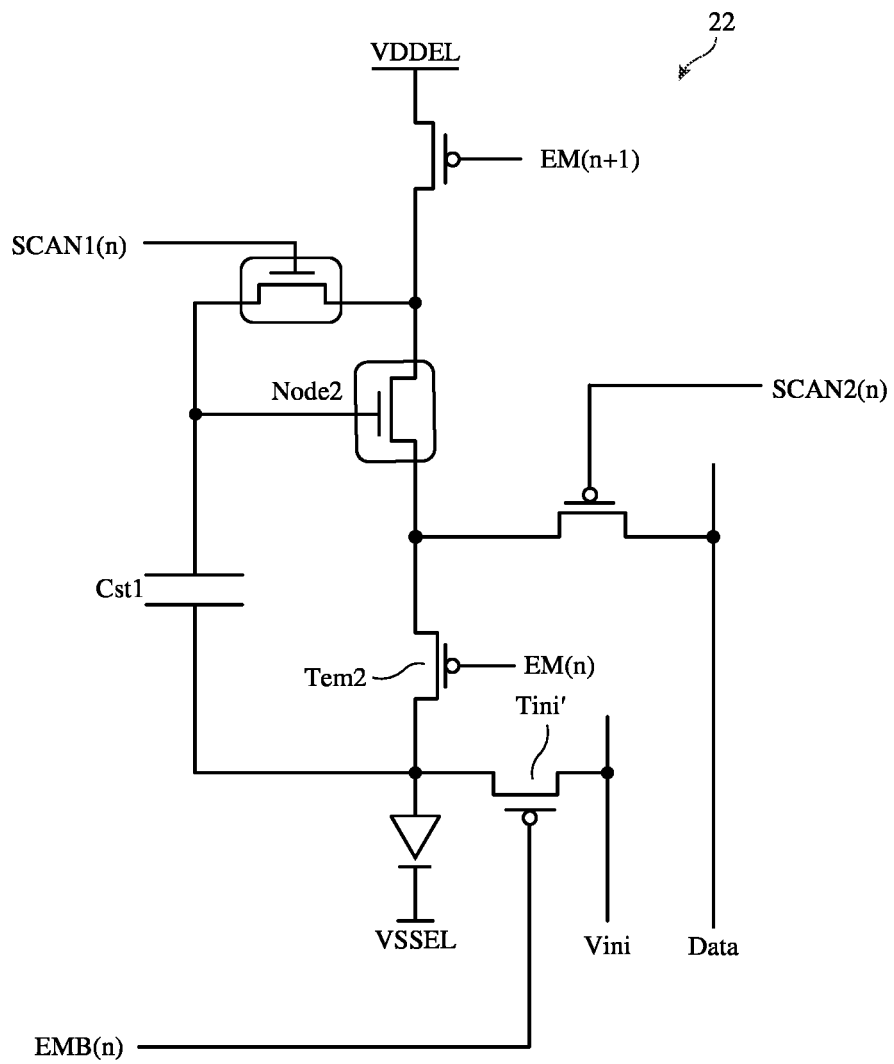
FIG. 4A is a circuit diagram of an illustrative display pixel having a semiconducting-oxide drive transistor and a silicon initialization transistor in accordance with an embodiment.

FIG. 4A is a circuit diagram showing another suitable arrangement of display pixel 22. The pixel structure of FIG. 4A is similar to that shown and described in connection with FIG. 3A but the initialization transistor is instead implemented using a p-type silicon transistor. As shown in FIG. 4A, the initialization transistor such as transistor Tini' is a p-channel silicon transistor. Since initialization transistor Tini' should not be turned on during the emission phase, initialization transistor Tini' cannot be controlled by signal EM(n) but is instead controlled using an inverted version of signal EM(n) denoted as signal EMB(n). Configured in this way, transistors Tem2 and Tini' will never be on at the same time (e.g., when transistor Tem2 is on, transistor Tini' will be off and vice versa). The remaining components and connections of pixel 22 are similar to that already described in connection with FIG. 3A and need not be reiterated in detail.

Figure 4B:
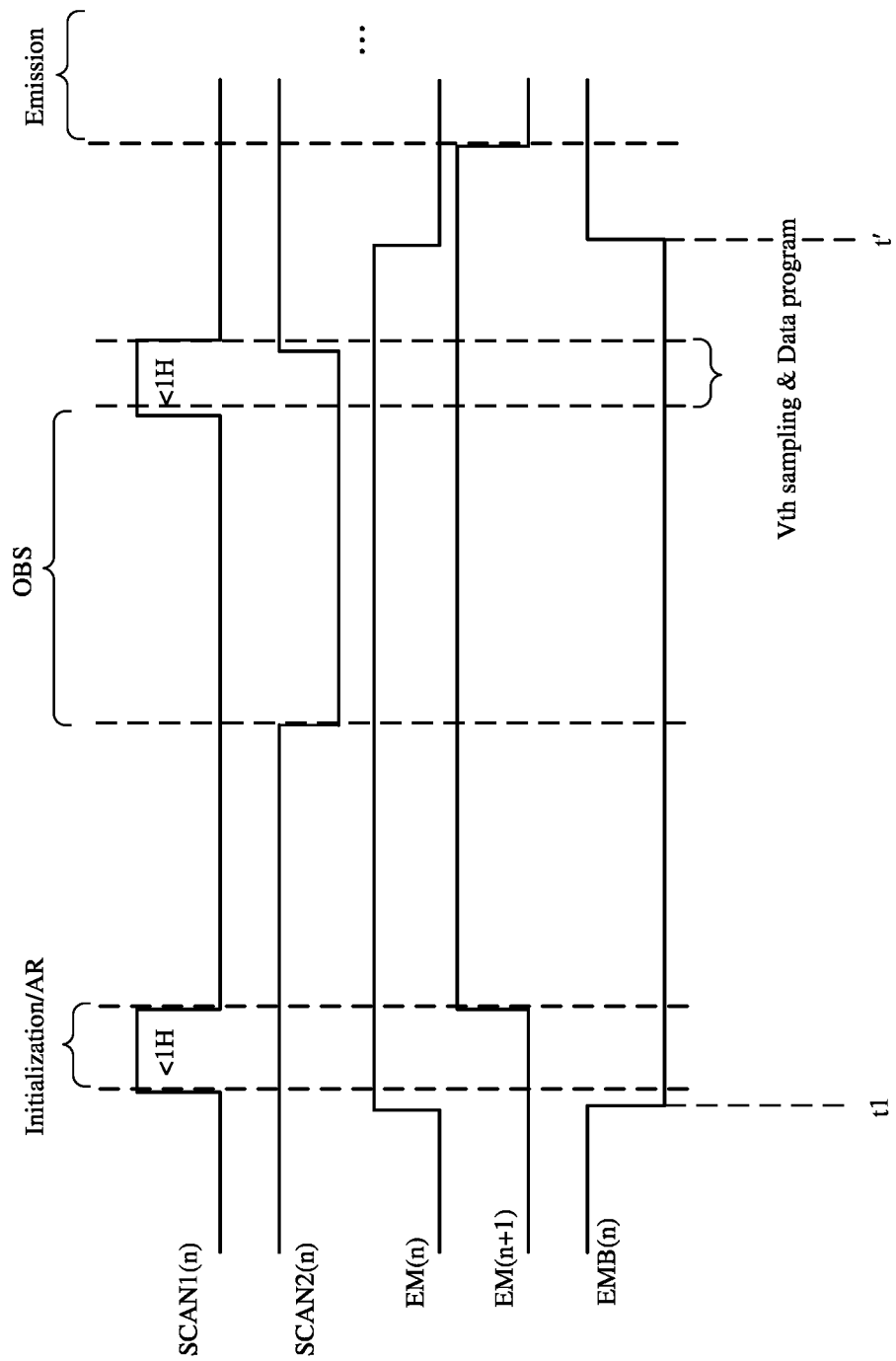
FIG. 4B is a timing diagram illustrating one suitable way of operating the display pixel shown in FIG. 4A in accordance with an embodiment.

FIG. 4B is a timing diagram illustrating one suitable way of operating the display pixel shown in FIG. 4A. The waveforms of FIG. 4B are similar to that shown and described in connection with FIG. 4A but with an additional signal EMB(n). As shown in FIG. 4B, signal EMB(n) is an inverted version of signal EM(n). Configured in this way, transistor Tinit' will be turned on by a low signal EMB(n) starting from the beginning of the initialization period until when signal EMB(n) is driven high before the emission phase at time t'. The initialization/anode reset phase, the OBS phase, and the Vth sampling and data programming phase may be carried out in the way described above in connection with FIG. 3B and need not be repeated in detail.

Figure 5A:
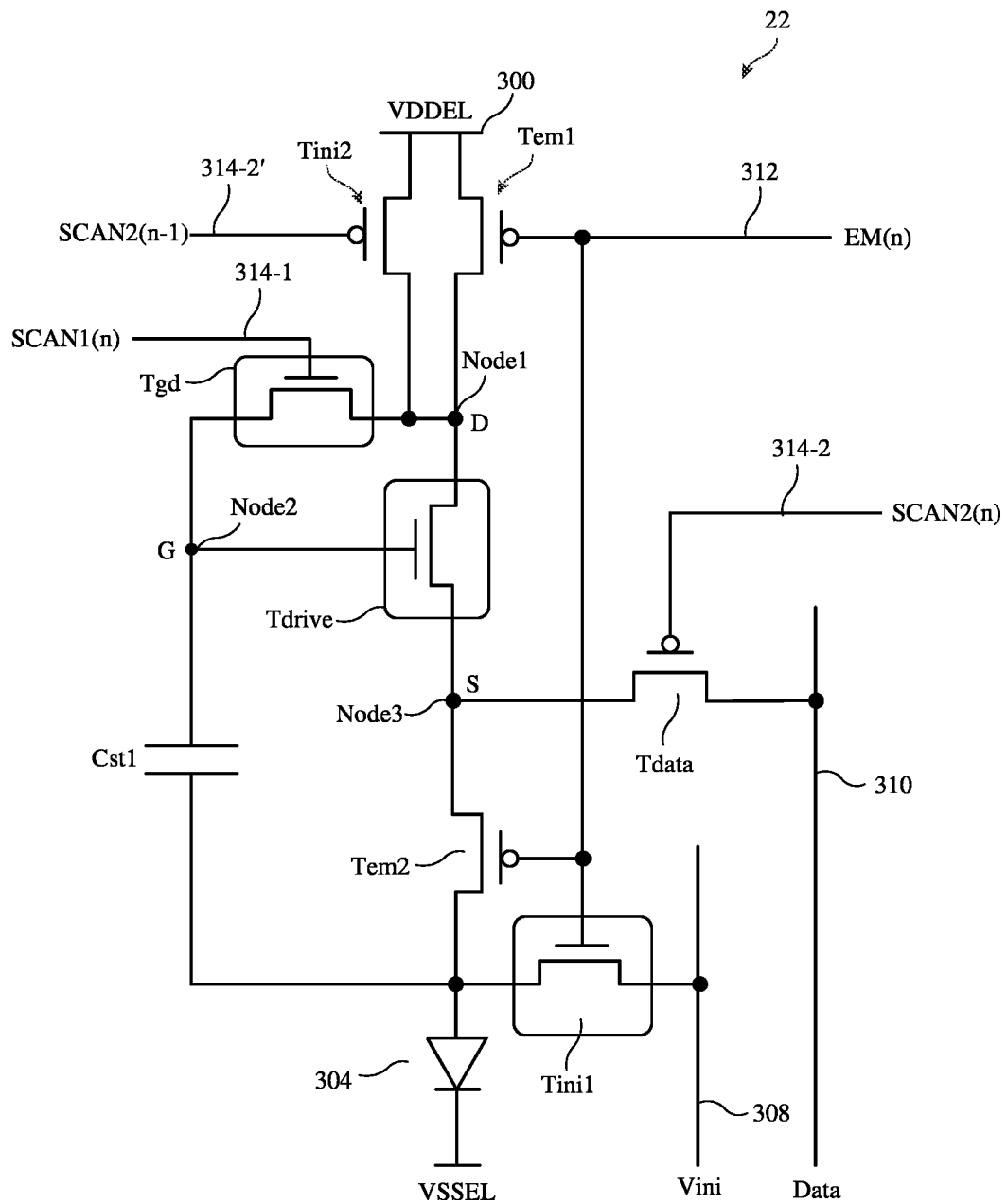
FIG. 5A is a circuit diagram of an illustrative display pixel having emission transistors and an initialization transistor that are controlled by a common emission signal in accordance with an embodiment.

FIG. 5A is a circuit diagram showing yet another suitable implementation of display pixel 22 having at least two initialization transistors. As shown in FIG. 5A, pixel 22 may include transistor Tem1, transistor Tdrive, transistor Tem2, and diode 304 coupled in series between power supply terminals 300 and 302. Storage capacitor Cst1 may be coupled between Node2 and the anode terminal of diode 304. Transistor Tgd that is controlled by signal SCAN1(n) on scan line 314-1 may be coupled across Node1 and Node2. Transistor Tdata that is controlled by signal SCAN2(n) on scan line 314-2 may be coupled to Node3. Pixel 22 may include a first initialization transistor Tini1 coupled to the anode terminal of diode 304. In the example of FIG. 5A, transistors Tgd, Tdrive, and Tini1 may all be implemented as semiconducting-oxide transistors (see transistors surrounded by circles) while all remaining transistors are implemented as p-type silicon transistors. This configuration is, however, merely illustrative. In general, any portion of pixel 22 of FIG. 5A may be implemented as semiconducting-oxide transistors and/or n-type/p-type silicon transistors.

In the example of FIG. 5A, transistors Tem1, Tem2, and Tini1 have gate terminals that are all configured to receive emission signal EM(n). Sharing signal EM(n) among the three transistors in this way obviates the need to have another emission signal in row n. When arranged in this way, however, transistor Tem1 is not able to pull Node1 up to VDDEL during the non-emission phase when signal EM(n) is driven high. As a result, pixel 22 may be provided with a second initialization transistor Tin2 coupled between power supply terminal 300 and Node1. Second initialization transistor Tin2 may be a p-type silicon transistor like the rest of the silicon transistors within the pixel and may be controlled by signal SCAN2(n−1) routed from an immediately preceding pixel row via routing path 314-2'. Signal SCAN2(n−1) can be pulsed low during the non-emission phase to help set Node1 to VDDEL during the initialization/anode reset phase. One such way of operating pixel 22 of FIG. 5A is illustrated in the timing diagram of FIG. 5B.

Prior to time t0, emission signal EM(n) is low, thereby turning on both emission transistors Tem1 and Tem2, so pixel 22 is in the emission phase. At time t0, signal EM(n) is driven high to temporarily halt emission. At time t1, signal SCAN1(n) is driven high to turn on transistor Tgd while signal SCAN2(n−1) is pulsed low to temporarily activate second initialization transistor Tini2. Turning on both transistors Tgd and Tini2 in this way initializes pixel 22 by setting Node1 to positive power supply voltage VDDEL. During this time, signal
EM(n) is also high, which enables first initialization transistor Tini1 to load initialization voltage Vini onto the anode terminal of diode 304 (i.e., the anode terminal is set to Vini). The period from time t1 to t2 is therefore sometimes referred to as the "initialization" or "anode reset" phase.

At time t3, signal SCAN2(n) is pulsed low, which turns on transistor Tdata to load in a desired data value D (n) onto Node3. Since signal SCAN1(n) remains high during this time, the drive transistor remains in the diode-connected configuration, so both data signal Vdata and the drive transistor threshold voltage Vth will be sampled onto the storage capacitor Cst1. At time t4, signal SCAN1(n) is driven low to turn off transistor Tgd while signal SCAN2(n) is driven high to turn off transistor Tdata, thereby ending the Vth sampling and data programming phase. At time t5, signals EM(n) is driven low to start the emission phase.

Figure 5B:
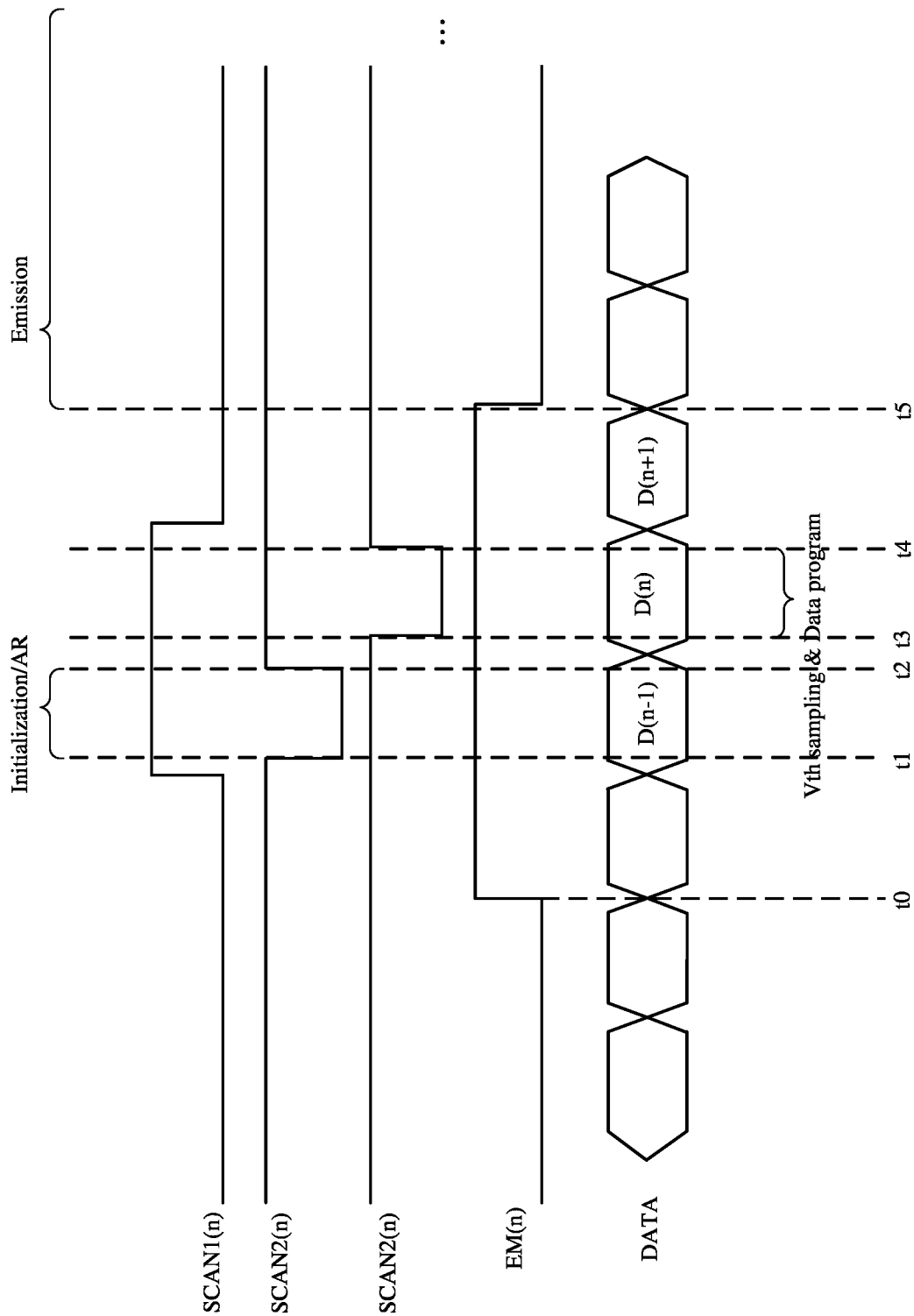
FIG. 5B is a timing diagram illustrating one suitable way of operating the display pixel shown in FIG. 5A in accordance with an embodiment.

In the example of FIG. 5B, the Vth sampling and data programming phase immediately follows the initialization phase. This is merely illustrative and is not intended to limit the scope of the present embodiments. If desired, one or more OBS phases may be inserted between the initialization phase and the data programming phase, and/or one or more OBS phases may be inserted between the data programming phase and the emission phase.

Figure 6:
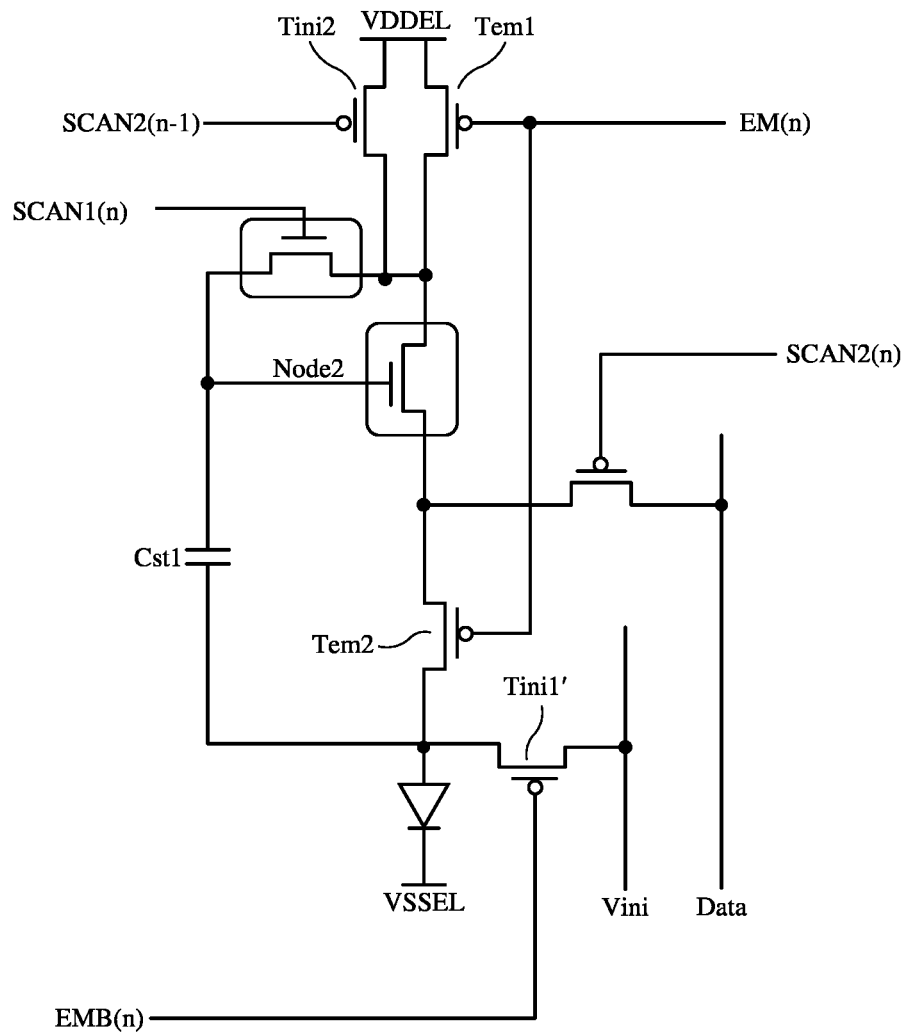
FIG. 6 is a circuit diagram of an illustrative display pixel having emission transistors controlled by a common emission signal and silicon initialization transistors in accordance with an embodiment.

FIG. 6 is a circuit diagram showing yet another suitable arrangement of display pixel 22. The pixel structure of FIG. 6 is similar to that shown and described in connection with FIG. 5A but the first initialization transistor Tini' is instead implemented using a p-type silicon transistor. As shown in FIG. 6, the initialization transistor such as transistor Tini' is a p-channel silicon transistor. Since initialization transistor Tini' should not be turned on during the emission phase, initialization transistor Tini' should no longer be controlled by signal EM(n) but is instead controlled using an inverted version of signal EM(n) denoted as signal EMB(n). Configured in this way, transistors Tem2 and Tini' will never be on at the same time (e.g., when transistor Tem2 is on, transistor Tini' will be off and vice versa). The remaining components and connections of pixel 22 are similar to that already described in connection with FIG. 5A and need not be reiterated in detail in order not to obscure the present embodiment. The operation of pixel 22 of FIG. 6 is identical to the timing diagram shown in FIG. 5B except with an additional inverted emission signal EMB(n) controlling transistor Tini1'.

Figure 7A:
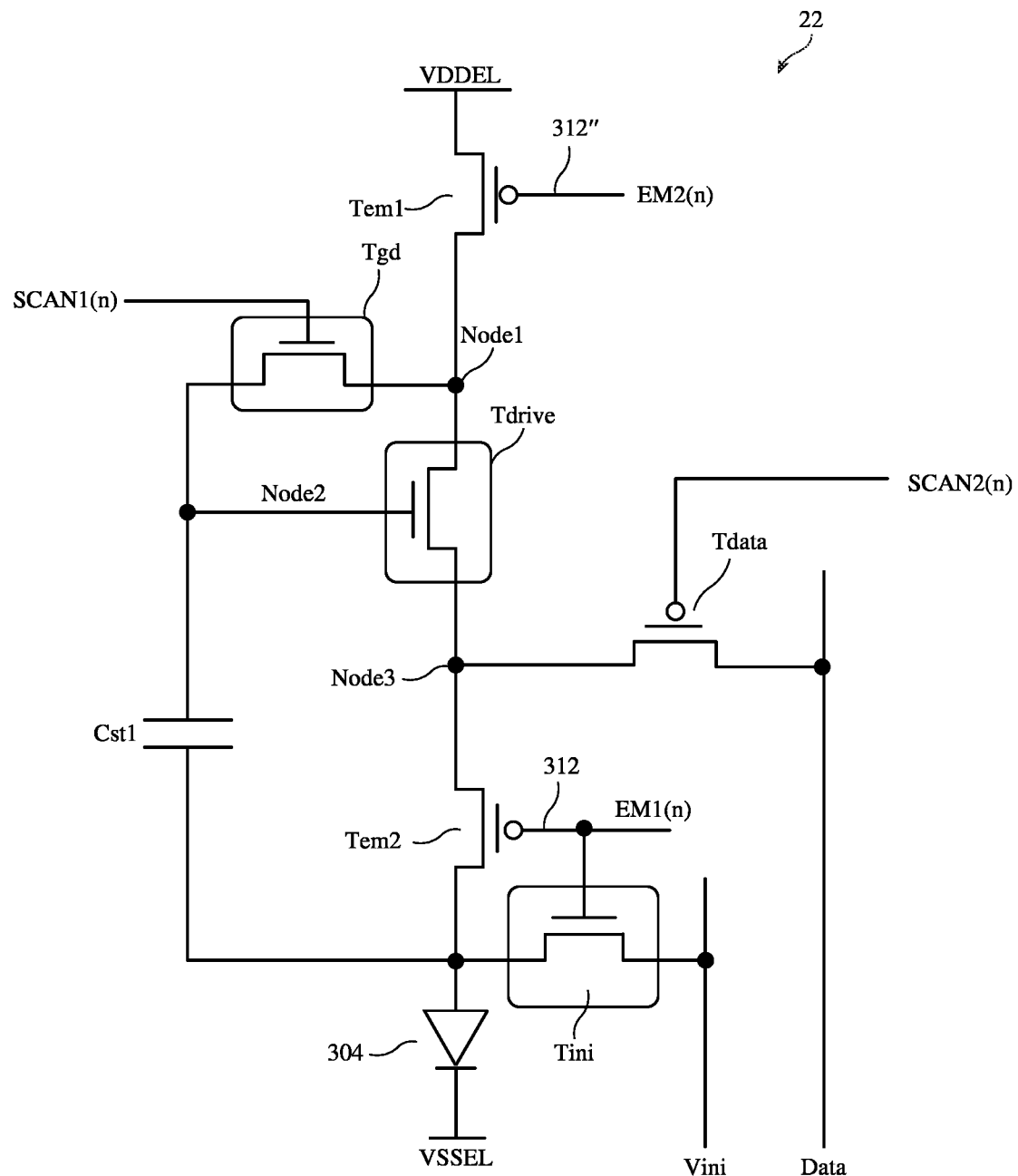
FIG. 7A is a circuit diagram of an illustrative display pixel that is controlled using two dedicated emission signals per row in accordance with an embodiment.

FIG. 7A illustrates another suitable arrangement of display pixel 22. The display pixel 22 of FIG. 7A has a similar pixel structure as that shown in FIG. 3A except the first emission transistor Tem1 is configured to receive a second emission signal EM2(n) provided with emission line 312". In other words, row n has two dedicated emission lines 312 and 312". The remaining components and connections in pixel 22 are the same as that already described in connection with FIG. 3A and need not be described again in detail in order not to obscure the present embodiment.

Figure 7B:
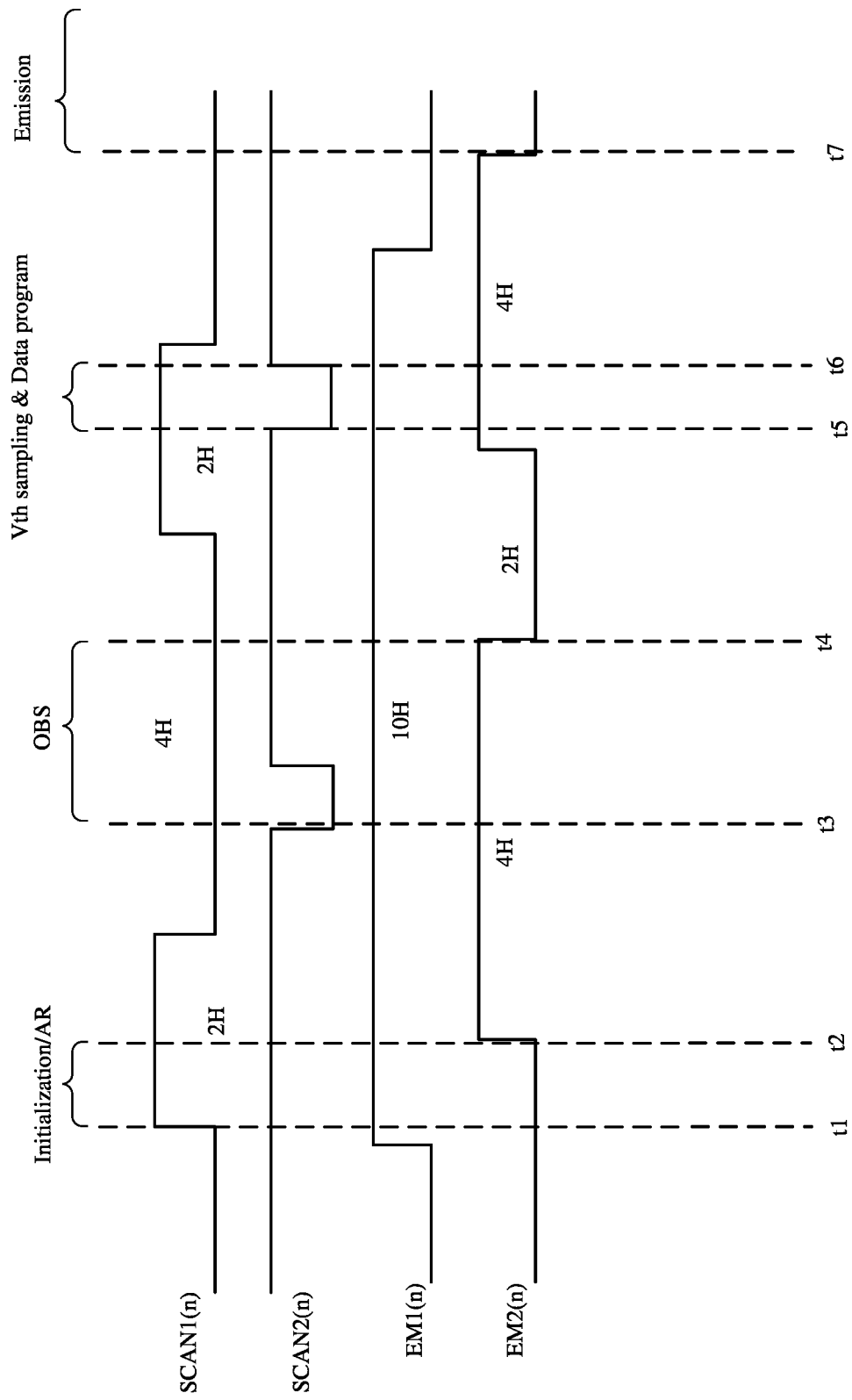
FIG. 7B is a timing diagram illustrating one suitable way of operating the display pixel shown in FIG. 7A in accordance with an embodiment.

FIG. 7B is a timing diagram illustrating one suitable way of operating the display pixel shown in FIG. 7A in accordance with an embodiment. Prior to time t1, emission signals EM1(n) and EM2(n) are both low, so transistors Tem1 and Tem2 are both on to allow an emission current to flow from transistor Tdrive down through diode 304.

The initialization/anode reset phase occurs from time t1 to t2. At time t1, signal EM1(n) is driven high for ten row periods (10H) to turn off second emission transistor Tem2 while signal SCAN1(n) is driven high for two row periods (2H) to turn on gate setting transistor Tgd. Since signal EM2(n) is still low, transistor Tem1 is still on, which pulls Node2 up to VDDEL. During this time, the high EM1(n) signal also turns on transistor Tini which loads in initialization voltage Vini onto the anode terminal of diode 304. The initialization/AR reset phase terminates when signal EM2(n) is driven high for four row periods (4H) at time t2 to disable transistor Tem1.

The on-bias stress (OBS) phase occurs from time t3 to t4. At time t3, signal SCAN2(n) is pulsed low to temporarily activate transistor Tdata to load some non-zero data value onto Node3. The Vth and data sampling does not yet take place with transistor Tgd is currently in the off state (i.e., Node2 is still at the previous initialized level of VDDEL). As described above in connection with FIG. 3B, performing pre-stress in this way can help mitigate drive transistor Vth hysteresis and improve first frame response.

The Vth sampling and data writing phase occurs from time t5 to t6. At time t5, signal SCAN2(n) is pulsed low while signal EM2(n) is driven high for four row periods (4H) and while signal SCAN1(n) is high. Operated in this way, a desired data signal that is intended for row n may be loaded onto Node3 using transistor Tdata while transistor Tem1 is turned off (e.g., thereby allowing Node1 to change voltage levels) and while transistor Tgd is turned on to place transistor Tdrive in the diode-connected configuration (e.g., thereby biasing both Node1 and Node2 to [Vdata+Vth]). Thus, at the end of the data programming phase at time t6, the value of both Vdata and Vth will be sampled onto storage capacitor Cst1. At time t7, both signals EM1(n) and EM2(n) are driven low and will allow a corresponding amount of emission current to flow through OLED 304.

Figure 8A:
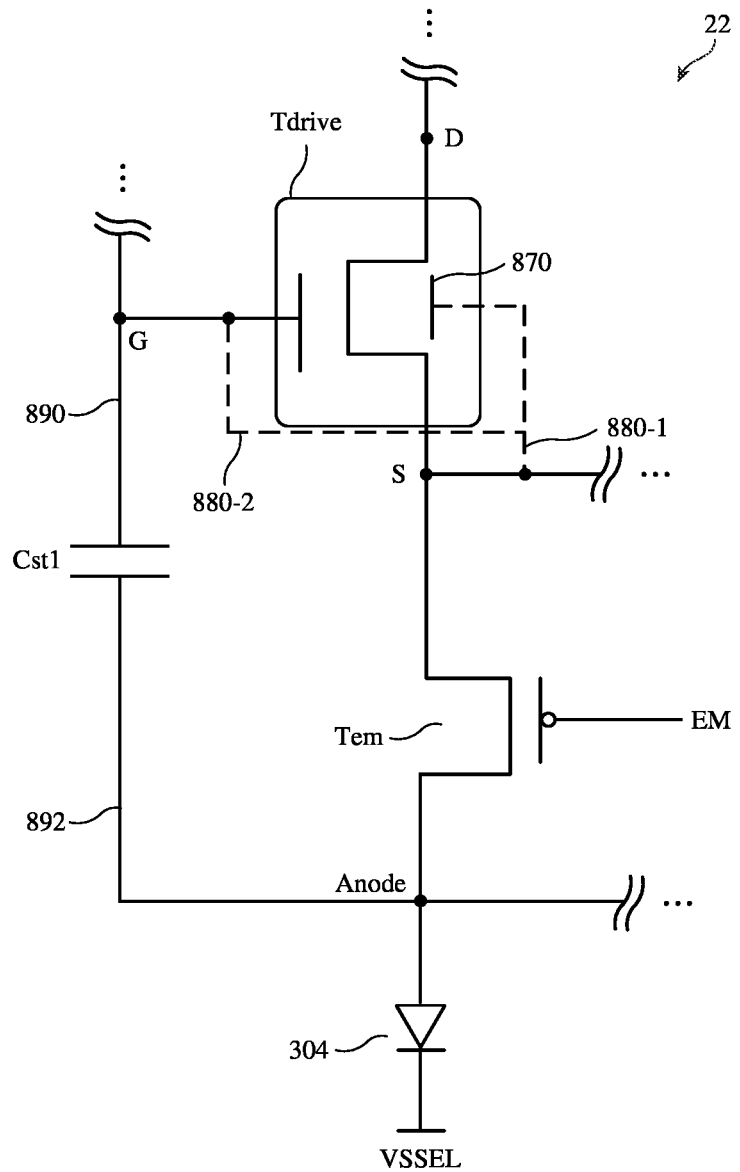
FIG. 8A is a circuit diagram of a portion of a display pixel having a semiconducting-oxide drive transistor coupled to a storage capacitor in accordance with an embodiment.

FIG. 8A is a circuit diagram showing only a portion of display pixel 22. As shown in FIG. 8A, pixel 22 may include at least OLED 304, transistor Tdrive (e.g., a drive transistor implemented as a semiconducting-oxide transistor), storage capacitor Cst1 coupled across the gate terminal of the drive transistor and the anode terminal of the OLED 304, and an emission transistor Tem (e.g., a transistor implemented as a p-type silicon transistor) coupled in series with the drive transistor and the OLED 304. In general, pixel 22 may include additional transistors coupled to the gate terminal of the drive transistor, coupled to the drain terminal of the drive transistor, coupled to the source terminal of the drive transistor, and/or coupled to the anode terminal of the OLED (as indicated by the ellipses). In general, the first terminal of the storage capacitor (i.e., the terminal connected to the gate terminal of transistor Tdrive) may be considered a high impedance node since no current can actually flow into the gate terminal of transistor Tdrive, whereas the second terminal of the storage capacitor (i.e., the terminal connected to the anode terminal of the OLED) may be considered a low impedance node since it sits along the path of the emission current.

Figure 8B:
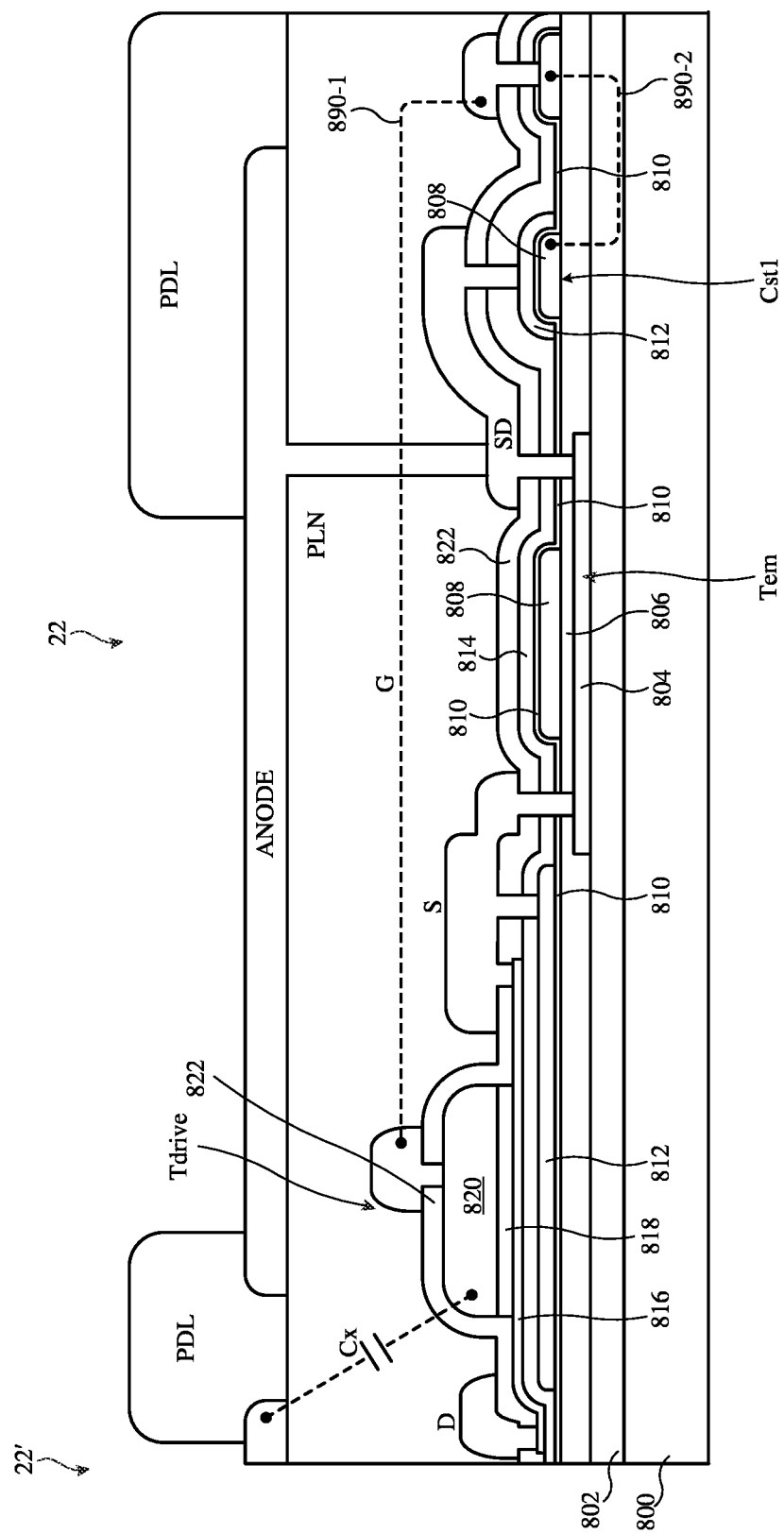
FIG. 8B is a cross-sectional side view of one suitable arrangement of the display pixel of FIG. 8A in accordance with an embodiment.

FIG. 8B is a cross-sectional side view showing one suitable arrangement of display pixel 22 of FIG. 8A. As shown in FIG. 8B, pixel 22 may include a substrate such as a polyimide substrate 800, one or more buffer layers 802 formed on the substrate, active silicon material such as LTPS material 804 formed on buffer layers 802, a first gate insulating (GI1) layer 806 formed over the silicon material, a first gate conductor (GE1) layer 808 formed on the first gate insulating layer 806, a first interlayer dielectric (ILD1) film 810 formed over the first gate conductor layer 808, a second gate conductor (GE2) layer 812 formed on the layer 810, a second interlayer dielectric (ILD2) film 814 formed over the second gate conductor layer 812, active semiconducting-oxide material such as IGZO material 816 formed on layer 814, a second gate insulating (GI2) layer 818 formed over the semiconducting-oxide (IGZO) material 816, an oxide gate (OxGE) layer 820 formed over the second gate insulating layer 818, a third interlayer dielectric (Ox-ILD) film 822 formed over the oxide gate layer 820 and covering layer 814.

In the example of FIG. 8B, at least one planarization layer PLN is formed over layer 822. This arrangement is, however, merely illustrative and is not intended to limit the scope of the present embodiments. If desired, at least two planarization layers may be implemented in the overall display stack. Such dual planarization layer configuration that can be used is described in detail in Ono et al. (a commonly owned U.S. patent application Ser. No. 15/729,330 filed on Oct. 10, 2017), which is incorporated herein by reference in its entirety. The anode terminal may be formed on the one or more planarization layer(s) PLN. A pixel defining layer PDL may be formed over the anode layer. Pixel 22 may include other pixel structures such as an emissive layer, a cathode layer, and encapsulation layers, which are not shown and described herein in order not to obscure the present embodiments.

In the stackup of FIG. 8B, semiconducting-oxide transistor Tdrive is formed above silicon transistor Tem. Drive transistor Tdrive may also be provided with a bottom gate light shield formed using layer 812. In particular, storage capacitor Cst1 has a first terminal implemented using layer 808 and a second terminal implemented using layer 812. The top gate conductor 820 of transistor Tdrive is coupled to the first terminal of the storage capacitor, as shown schematically by dotted paths 890-1 and 890-2. The second terminal of the storage capacitor is coupled to transistor Tem and the anode terminal through associated source-drain contact vias.

In the arrangement of FIG. 8B, there may be a large parasitic capacitance Cx between the gate conductor 820 of transistor Tdrive and the anode terminal of an adjacent pixel 22'. This parasitic capacitance may lead to undesired crosstalk between neighboring pixels. Pixel crosstalk generated in this way can perturb the voltage at the gate terminal of transistor Tdrive, which is especially susceptible to noise since it is a high impedance node. It would therefore be desirable to provide an improve way for mitigating pixel crosstalk at the gate terminal of the semiconducting-oxide transistor Tdrive.

Figure 8C:
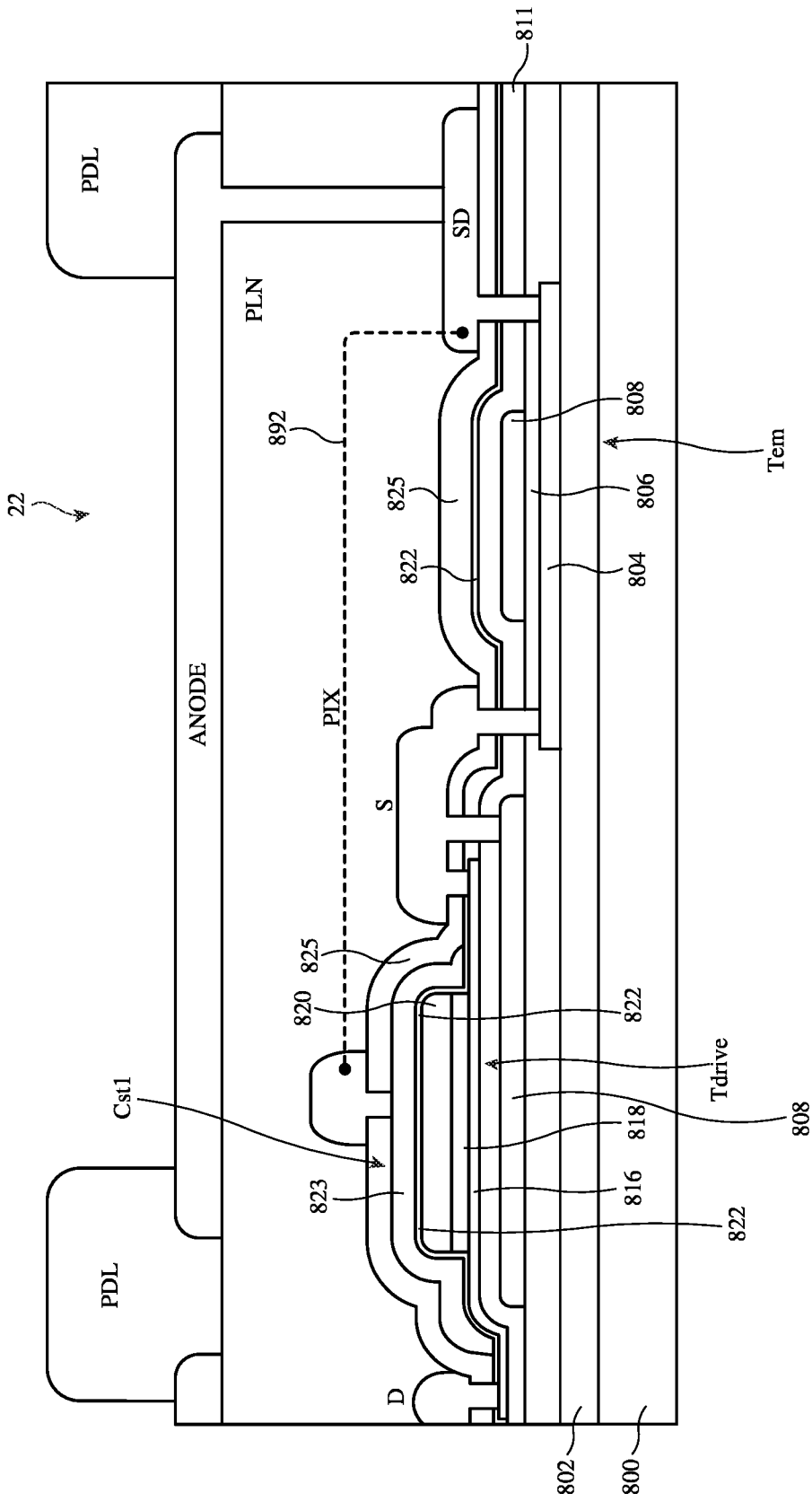
FIG. 8C is a cross-sectional side view of another suitable arrangement of the display pixel of FIG. 8A where the storage capacitor is stacked on top of the semiconducting-oxide drive transistor in accordance with an embodiment.

In accordance with an embodiment, FIG. 8C illustrates a cross section where the storage capacitor is stacked on top of the semiconducting-oxide drive transistor. As shown in FIG. 8C, pixel 22 may include a substrate/carrier such as a polyimide substrate 800, one or more buffer layers 802 formed on the substrate, active silicon material such as LTPS material 804 formed on buffer layers 802, a first gate insulating (GI1) layer 806 formed over the silicon material 804, a first gate conductor (GE1) layer 808 formed on the first gate insulating layer 806, an interlayer dielectric (ILD) film 811 formed over the first gate conductor layer 808, active semiconducting-oxide material such as IGZO material 816 formed on layer 811, a second gate insulating (GI2) layer 818 formed over the semiconducting-oxide (IGZO) material 816, an oxide gate (OxGE) layer 820 formed over the second gate insulating layer 818, a first oxide interlayer dielectric (Ox-ILD1) film 822 formed over the oxide gate layer 820 and covering layer 808, another gate conductor (GE2) layer 823 formed on layer 822, and a second oxide interlayer dielectric (Ox-ILD2) film 825 formed over the gate layer 823 and covering layer 822. Layer 811 is sometimes referred to as an oxide buffer layer.

In the example of FIG. 8B, at least one planarization layer PLN is formed over layer 825. This arrangement is, however, merely illustrative and is not intended to limit the scope of the present embodiments. If desired, at least two planarization layers may be implemented in the overall display stack. Such dual planarization layer configuration that can be used is described in detail in Ono et al. (a commonly owned U.S. patent application Ser. No. 15/729,330 filed on Oct. 10, 2017), which is incorporated herein by reference in its entirety. The anode terminal may be formed on the one or more planarization layer(s) PLN. A pixel defining layer PDL may be formed over the anode layer. Pixel 22 may include other pixel structures such as an emissive layer, a cathode layer, and encapsulation layers, which are not shown and described herein in order not to obscure the present embodiments.

In the stackup of FIG. 8C, semiconducting-oxide transistor Tdrive is formed above silicon transistor Tem. Drive transistor Tdrive may also be provided with a bottom gate structure formed using layer 808. If desired, the bottom gate structure may serve as a light shield and/or as an active bottom gate in a dual/double gate semiconducting-oxide transistor. In one suitable arrangement, the bottom gate conductor can be shorted to the associated source terminal of the drive transistor (see, e.g., connection 880-1 in FIG. 8A) or can be connected to the associated gate terminal of the drive transistor (see, e.g., connection 880-2 in FIG. 8A). The bottom gate structure of the semiconducting-oxide drive transistor and the top gate conductor of silicon transistor Tem may also be formed from the same conductive layer (e.g., using layer 808).

Figure 8D:
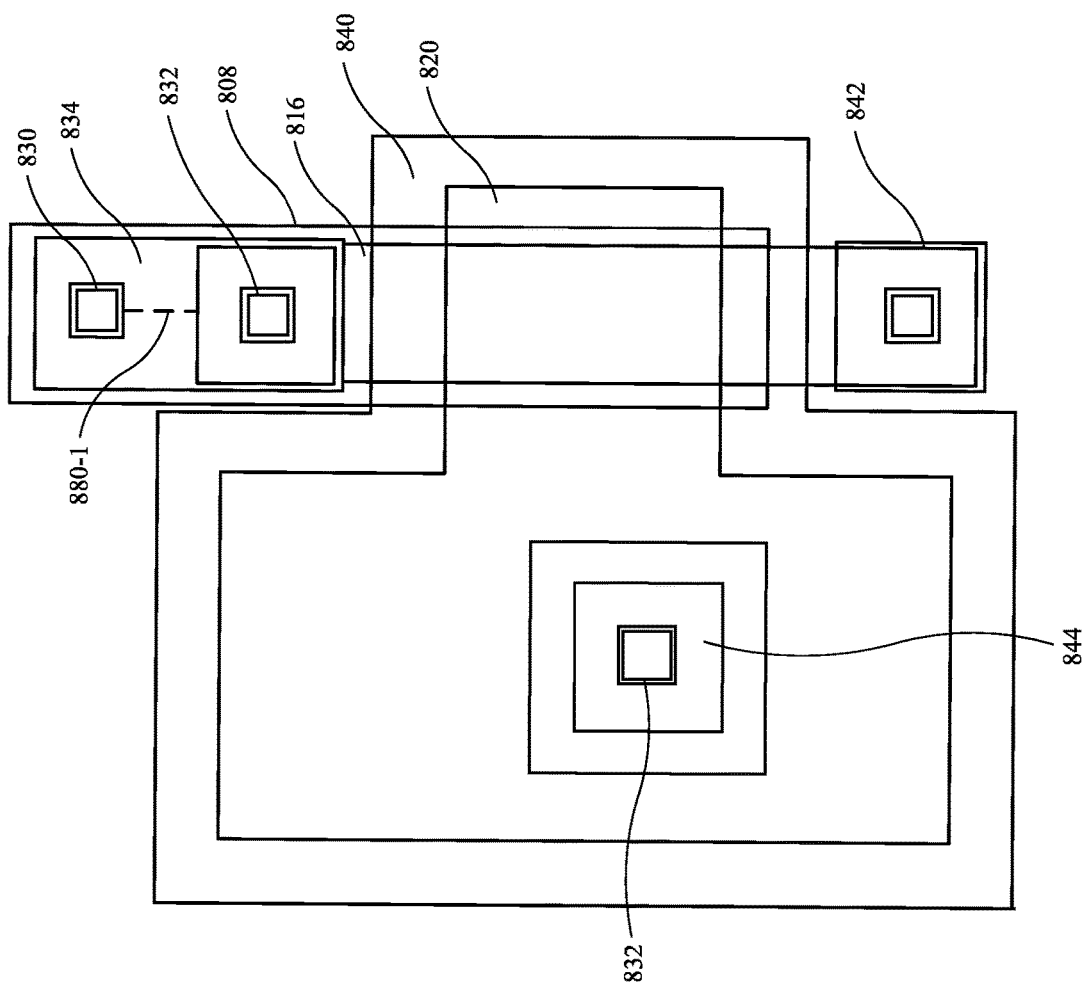
FIG. 8D is a top layout view showing how the bottom gate terminal of the semiconducting-oxide drive transistor may be connected to its source terminal in accordance with an embodiment.

FIG. 8D is a top layout view showing how the bottom gate terminal of the semiconducting-oxide drive transistor may be connected to its source terminal. As shown in FIG. 8D, the source of transistor Tdrive may be coupled to its bottom gate structure GE1 by forming contact holes 830 and 832, as indicated by dotted connection path 880-1. Contact hole 832 can be fabricated at the same time as contact hole 830. Layer 834 may represent the source terminal of transistor Tdrive. Layer 808 may represent the bottom gate layer of transistor Tdrive. Layer 816 may represent the semiconducting-oxide material (e.g., IGZO, ITZO, etc.). Layer 840 may represent the GE2 layer, which can be connected to the source of transistor Tdrive during the emission phase. Layer 820 may represent the top gate conductor of transistor Tdrive. Layer 842 may represent the drain terminal of transistor Tdrive. Layer 844 may represent the gate terminal of transistor Tdrive.

Figure 8E:
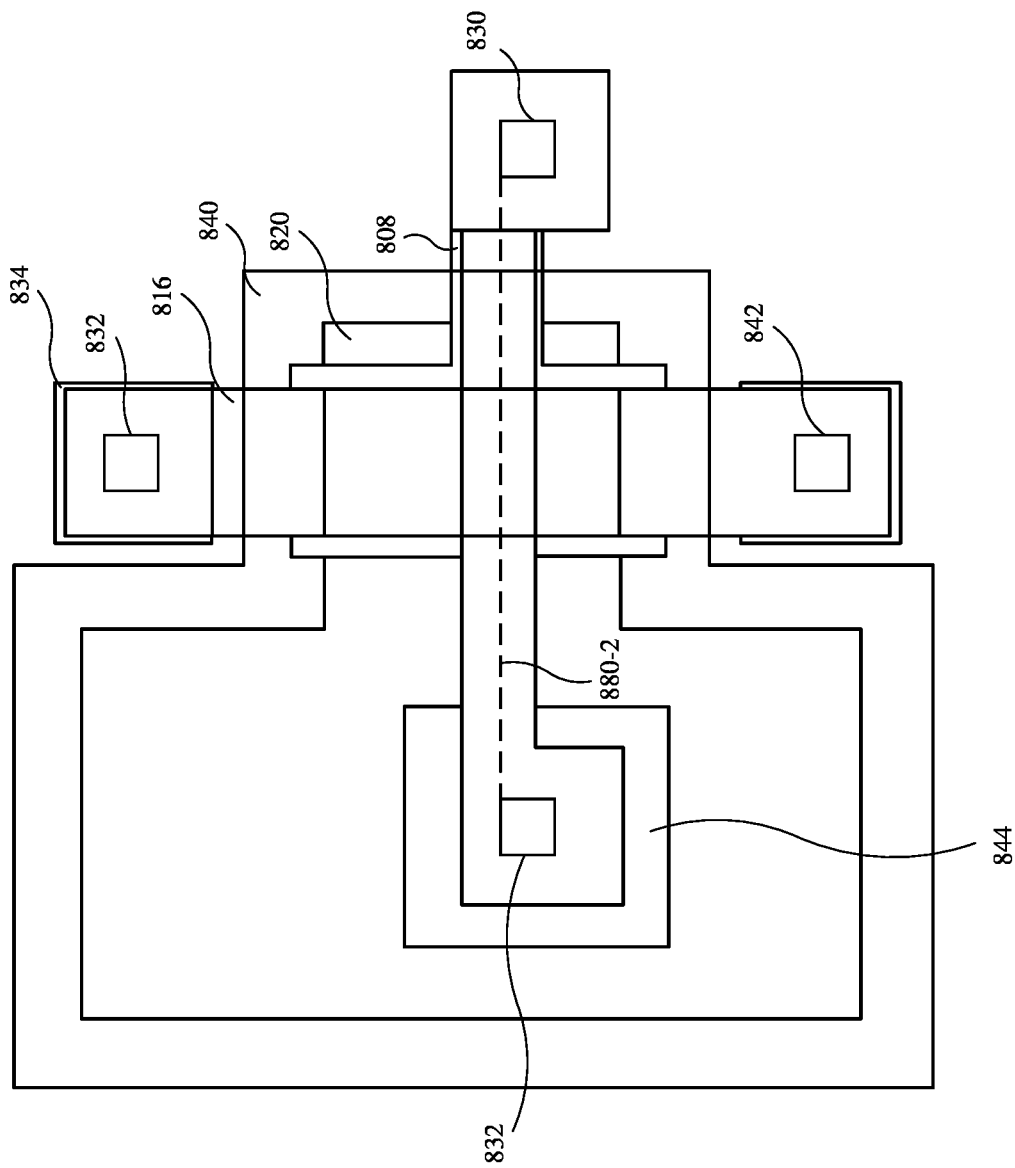
FIG. 8E is a top layout view showing how the bottom gate terminal of the semiconducting-oxide drive transistor may be connected to its top gate terminal in accordance with an embodiment.

FIG. 8E is a top layout view showing how the bottom gate terminal of the semiconducting-oxide drive transistor may be connected to its top gate terminal. As shown in FIG. 8E, the top gate structure of transistor Tdrive may be coupled to its bottom gate structure by forming contact holes 830 and 832, as indicated by dotted connection path 880-2. Contact hole 832 can be fabricated at the same time as contact hole 830. Layer 834 may represent the source terminal of transistor Tdrive. Layer 808 may represent the bottom gate layer of transistor Tdrive. Layer 816 may represent the semiconducting-oxide material (e.g., IGZO, ITZO, etc.). Layer 840 may represent the GE2 layer. Layer 820 may represent the top gate conductor of transistor Tdrive. Layer 842 may represent the drain terminal of transistor Tdrive. Layer 844 may represent the gate terminal of transistor Tdrive.

Referring back to FIG. 8C, storage capacitor Cst1 may be stacked above the semiconducting-oxide transistor Tdrive. Configured in this way, gate layer 820 serves simultaneously as the gate conductor of transistor Tdrive and as the bottom plate of capacitor Cst1. The topmost gate layer 823 may serve as the top plate of capacitor Cst1. The bottom place of capacitor Cst1 may be coupled to the corresponding anode terminal of pixel 22, as indicated by schematic connected path 892. In this arrangement, the gate conductor of semiconducting-oxide transistor Tdrive is now covered and shielded by topmost gate layer 823. This is also shown in FIGS. 8D and 8E where shielding layer 840 is wider than the footprint of the top gate conductor 820 of Tdrive. As a result, any parasitic capacitance with the neighboring pixel will only be coupled to the bottom plate of capacitor Cst1, which is a low impedance node and is relatively less susceptible to pixel crosstalk compared with the embodiment of FIG. 8B. Furthermore, gate layer 840 can provide additional light shielding from above transistor Tdrive, which can allow for more flexible patterning of the anode layer. The shield 840 can also help prevent or mitigate hydrogen penetration into the channel of transistor Tdrive. In one suitable embodiment, the top capacitor electrode 840 may include different stacked metals. As examples, the top capacitor electrode may be formed using hydrogen-shielding material such as titanium or tungsten or other suitable hydrogen blocking material, which can optionally be combined with relatively higher-conductivity material such as molybdenum, aluminum, copper, silver or other relatively more conductive metals.

In other words, forming capacitor Cst1 directly on top of semiconducting-oxide transistor Tdrive can help provide at the following technical advantages: (1) electrical shielding of the oxide gate conductor to mitigate any potential pixel crosstalk issues, (2) optical shielding of the semiconducting-oxide transistor to allow for more flexible anode layer patterning, and (3) shielding of hydrogen penetration into the channel region of the semiconducting-oxide transistor.

The display stackup shown in FIGS. 8B and 8C may be applied to any of the pixel arrangements illustrated in FIGS.

3-7. In general, any of the various semiconducting-oxide transistors in display pixels 22 may have the double gate structure shown in FIG. 8C, and the gate conductors of those transistors may be optionally shielded using the topmost GE2 layer as shown in FIG. 8C. In scenarios where display pixel 22 includes more than one capacitor, any additional capacitor may be stacked on top of one or more of the semiconducting-oxide transistors or on top of one or more of the LTPS transistors to provide desired electrical and/or optical protection.

Figure 9:
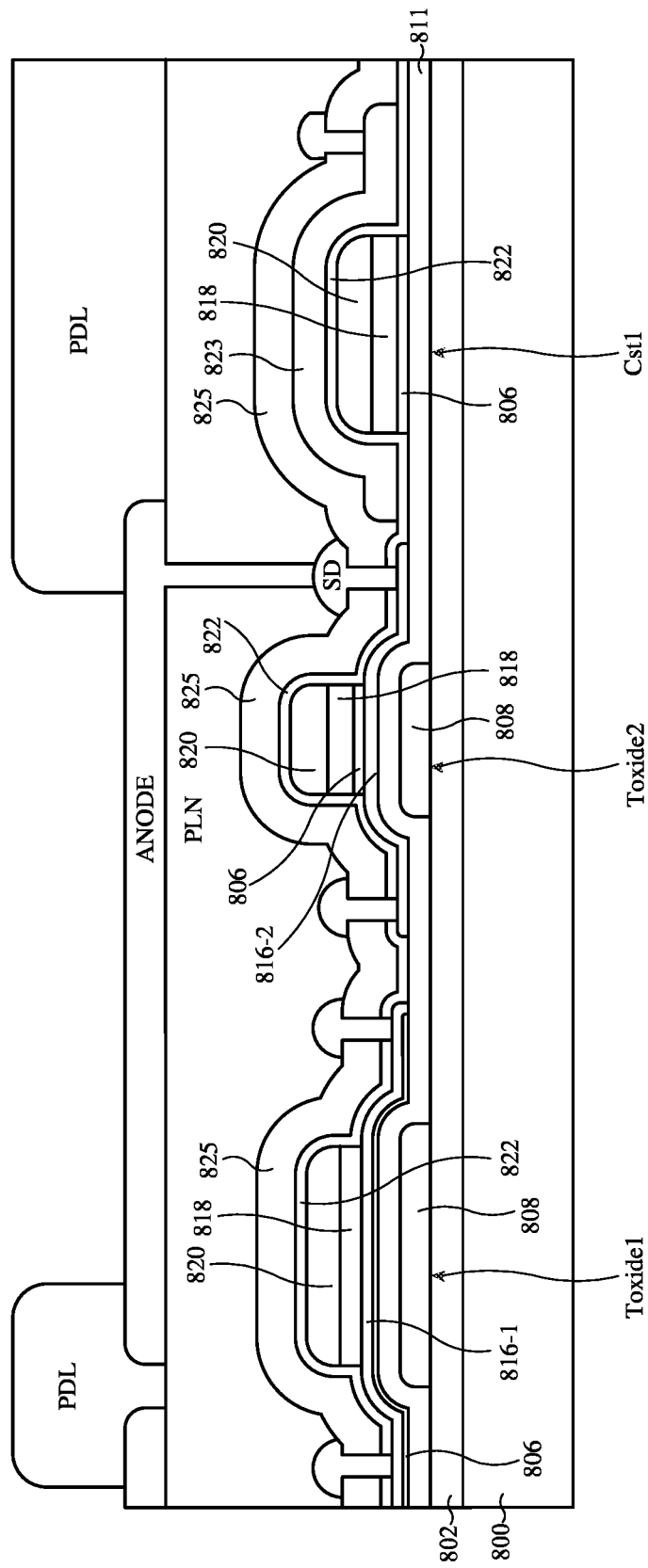
FIG. 9 is a cross-sectional side view showing a portion of the display pixel of FIG. 3A where two semiconducting-oxide transistors are formed in different layers in the display stack in accordance with an embodiment.

FIG. 9 is a cross-sectional side view showing a portion of the display pixel of FIG. 3A where two semiconducting-oxide transistors are formed in different layers in the display stack. As shown in FIG. 9, the first semiconducting-oxide transistor Toxide1 may have its active semiconducting-oxide layer (labeled as 816-1) formed directly on the first gate insulating (GI1) layer 806, whereas the second semiconducting-oxide transistor Toxide2 may have its active semiconducting-oxide layer (labeled as 816-2) formed directly on the oxide buffer layers 811. In other words, layer 816-1 may be formed above layer 816-2, and conversely layer 816-2 is formed below layer 816-1. Even though the oxide layers of transistors Toxide1 and Toxide2 are formed in different layers, the gate 820 of transistor Toxide1 and the gate 820 of transistor Toxide2 may be formed in the same layer. The second gate insulating (GI2) layer 818 may be formed immediately under gate layer 820. A first oxide ILD layer 822 may be formed over layer 820, and a second oxide ILD layer 825 may be formed on layer 822. Transistor Toxide1 may have a gate insulator thickness that is greater than, less than, or equal to the gate insulator thickness of transistor Toxide2.

In one suitable arrangement, Toxide1 may represent the drive transistor Tdrive, whereas Toxide2 may represent either the gate setting transistor Tgd, initialization transistor Tini, or any other semiconducting-oxide transistor in pixel 22 (if present). In another suitable arrangement, Toxide2 may represent the drive transistor Tdrive, whereas Toxide1 may represent either the gate setting transistor Tgd, initialization transistor Tini, or any other semiconducting-oxide transistor in pixel 22 (if present). In the example of FIG. 9, storage capacitor Cst may have a bottom plate formed using oxide gate layer 820 and a top plate formed using gate metal layer 823.

The example of FIG. 9 shows only one planarization layer. This arrangement is, however, merely illustrative and is not intended to limit the scope of the present embodiments. If desired, at least two planarization layers may be implemented in the overall display stack. Such dual planarization layer configuration that can be used is described in detail in Ono et al. (a commonly owned U.S. patent application Ser. No. 15/729,330 filed on Oct. 10, 2017), which is incorporated herein by reference in its entirety. Moreover, the example of FIG. 9 shows storage capacitor Cst1 formed laterally with respect to the semiconducting-oxide transistors Toxide1 and Toxide2 (see, e.g., capacitor Cst1 with one electrode formed using OxGE and another electrode formed using GE2). This configuration is also merely exemplary. If desired, the storage capacitor Cst1 may be stacked on top of either Toxide1 or Toxide2 using an arrangement of the type shown in FIG. 8B to provide enhanced electrical, optical, and hydrogen penetration shielding.

The foregoing is merely illustrative and various modifications can be made by those skilled in the art without departing from the scope and spirit of the described embodiments. The foregoing embodiments may be implemented individually or in any combination.

What is claimed is:

1. A display pixel, comprising:
a light-emitting diode having an anode terminal;
a semiconducting-oxide drive transistor coupled in series with the light-emitting diode, wherein the semiconducting-oxide drive transistor has a gate terminal, a drain terminal, and a source terminal;
a first silicon emission transistor coupled between the semiconducting-oxide drive transistor and the light-emitting diode and configured to receive a first emission signal;
a second silicon emission transistor coupled between a power supply terminal and the semiconducting-oxide drive transistor and configured to receive a second emission signal that is a delayed version of the first emission signal;
a storage capacitor having a first terminal coupled to the gate terminal of the semiconducting-oxide drive transistor and a second terminal coupled to the anode terminal of the light-emitting diode;
a semiconducting-oxide gate voltage setting transistor coupled across the drain terminal and the gate terminal of the semiconducting-oxide drive transistor, wherein the semiconducting-oxide gate voltage setting transistor is configured to receive a first scan signal having a first pulse width for activating the semiconducting-oxide gate voltage setting transistor; and
a silicon data loading transistor coupled between a data line and the source terminal of the semiconducting-oxide drive transistor, wherein the silicon data loading transistor is configured to receive a second scan signal having a second pulse width, greater than the first pulse width, for activating the silicon data loading transistor to perform an on-bias stress operation, and wherein the first scan signal is pulsed after the on-bias stress operation.

2. The display pixel of claim 1, further comprising:
an initialization line on which an initialization voltage is provided; and
a semiconducting-oxide initialization transistor coupled between the initialization line and the anode terminal of the light-emitting diode.

3. The display pixel of claim 2, wherein the first and second silicon emission transistors comprise p-type silicon transistors.

4. The display pixel of claim 3, wherein the semiconducting-oxide initialization transistor is configured to receive the first emission signal.

5. The display pixel of claim 1, wherein the storage capacitor is stacked above the semiconducting-oxide drive transistor to provide shielding for the semiconducting-oxide drive transistor.

6. The display pixel of claim 1, wherein the semiconducting-oxide drive transistor comprises:
active semiconducting-oxide material;
a top gate conductor formed above the active semiconducting-oxide material; and
a bottom gate conductor that is formed below the active semiconducting-oxide material and that is coupled to a selected one of the gate terminal or the source terminal of the semiconducting-oxide drive transistor.

7. A method of operating a pixel in a given pixel row that includes a light-emitting diode, a drive transistor, a gate setting transistor, an initialization transistor, and a data loading transistor, the method comprising:

performing an initialization operation by asserting a first scan signal to activate the gate setting transistor and by deasserting an emission signal to activate the initialization transistor;

performing a threshold voltage sampling and data programming operation by asserting a second scan signal to activate the data loading transistor while the first scan signal is asserted;

asserting the emission signal prior to an emission operation; and during the initialization operation and the emission operation, asserting an additional emission signal from another pixel row different than the given pixel row to activate an emission transistor in the pixel, wherein the additional emission signal is deasserted during the threshold voltage sampling and data programming operation; and prior to the threshold voltage sampling and data programming operation, performing an on-bias stress operation by asserting the second scan signal to activate the data loading transistor while the first scan signal is deasserted and while the emission signal and the additional emission signal are deasserted.

8. The method of claim 7, further comprising:

generating a first pulse in the second scan signal to start the on-bias stress operation; and generating a second pulse in the second scan signal to start the threshold voltage sampling and data programming operation.

9. A display pixel in a given pixel row, comprising:

a light-emitting diode;

a semiconducting-oxide drive transistor coupled in series with the light-emitting diode;

a silicon data loading transistor coupled at a first source-drain terminal of the semiconducting-oxide drive transistor configured to receive a control signal that is pulsed multiple times during a data refresh period;

a semiconducting-oxide diode connecting transistor coupled at a gate terminal of the semiconducting-oxide drive transistor and configured to receive an additional control signal having a first value during a first pulse of the control signal and having a second value, different than the first value, during a second pulse of the control signal;

a first silicon emission transistor coupled at the first source-drain terminal of the semiconducting-oxide drive transistor and configured to receive an emission signal; and a second silicon emission transistor coupled at a second source-drain terminal of the semiconducting-oxide drive transistor and configured to receive an additional emission signal from another pixel row.

10. The display pixel of claim 9, wherein the semiconducting-oxide drive transistor has a channel formed from semiconducting-oxide material, and wherein the silicon data loading transistor and the first and second silicon emission transistors have channels formed from silicon material.

11. The display pixel of claim 9, further comprising: a semiconducting-oxide initialization transistor coupled at an anode terminal of the light-emitting diode and configured to receive the emission signal, the emission signal being asserted prior to an emission period.

12. The display pixel of claim 11, wherein the semiconducting-oxide drive transistor has a channel formed in a first semiconducting-oxide layer, and wherein at least one of the semiconducting-oxide diode connecting transistor and the semiconducting-oxide initialization transistor has a channel formed in a second semiconducting-oxide layer different than the first semiconducting-oxide layer.

* * * * *